(12) United States Patent
Anderson et al.

(10) Patent No.: US 8,754,425 B2
(45) Date of Patent: Jun. 17, 2014

(54) ELECTRICALLY PIXELATED LUMINESCENT DEVICE

(75) Inventors: James E. Anderson, St. Paul, MN (US); Nicole J. Wagner, Monrovia, CA (US); Tommie W. Kelley, Shoreview, MN (US); Andrew J. Ouderkirk, Singapore (SG); Craig R. Schardt, Woodbury, MN (US); Catherine A. Leatherdale, Woodbury, MN (US); Philip E. Watson, Singapore (SG)

(73) Assignee: 3M Innovative Properties Company, Saint Paul, MN (US)

( * ) Notice: Subject to any disclaimer, the term of this patent is extended or adjusted under 35 U.S.C. 154(b) by 303 days.

(21) Appl. No.: 13/062,113

(22) PCT Filed: Sep. 3, 2009

(86) PCT No.: PCT/US2009/055885
§ 371 (c)(1),
(2), (4) Date: Mar. 3, 2011

(87) PCT Pub. No.: WO2010/028146
PCT Pub. Date: Mar. 11, 2010

(65) Prior Publication Data
US 2011/0156616 A1  Jun. 30, 2011

Related U.S. Application Data

(60) Provisional application No. 61/095,205, filed on Sep. 8, 2008.

(51) Int. Cl.
*H01L 33/00* (2010.01)
*B41J 2/45* (2006.01)
*H01L 27/15* (2006.01)

(52) U.S. Cl.
CPC *H01L 27/156* (2013.01); *B41J 2/45* (2013.01)
USPC ........... 257/88; 257/94; 257/E33.008; 438/29

(58) Field of Classification Search
USPC ............. 257/13, 88, E33.008, E7.12, E27.12, 257/94; 315/312; 438/22, 29
See application file for complete search history.

(56) References Cited

U.S. PATENT DOCUMENTS 5,162,878 A  11/1992  Sasagawa
5,952,680 A  9/1999  Strite (Continued)

FOREIGN PATENT DOCUMENTS

JP  9-153644  6/1997
JP  2008-047618  2/2008

(Continued)

OTHER PUBLICATIONS

Chakraborty et al., Interdigitated Multipixel Arrays for the Fabrication of High-Power Light-Emitting Diodes With Very Low Series Resistances, Appl. Phys. Lett., vol. 88, pp. 181120-1-181120-3, (2006).

(Continued)

*Primary Examiner* — Tuan N. Quach
(74) *Attorney, Agent, or Firm* — Dainel J. Iden

(57) ABSTRACT

Electrically pixelated luminescent devices, methods for forming electrically pixelated luminescent devices, systems including electrically pixelated luminescent devices, and methods for using electrically pixelated luminescent devices are described. More specifically, electrically pixelated luminescent devices that have inner and outer semiconductor layers and a continuous light emitting region, as well as individually addressable electrodes are described.

17 Claims, 9 Drawing Sheets

(56) References Cited

U.S. PATENT DOCUMENTS

| | | | |
|---|---|---|---|
| 6,410,940 | B1 * | 6/2002 | Jiang et al. .................. 257/82 |
| 6,563,138 | B2 | 5/2003 | Ogihara |
| 6,600,175 | B1 | 7/2003 | Baretz |
| 6,784,462 | B2 | 8/2004 | Schubert |
| 6,897,855 | B1 | 5/2005 | Matthies |
| 6,900,473 | B2 | 5/2005 | Yoshitake |
| 6,987,613 | B2 | 1/2006 | Pocius |
| 7,060,542 | B2 | 6/2006 | Nakajima |
| 7,068,418 | B2 | 6/2006 | Kawase |
| 7,129,528 | B2 | 10/2006 | Bader |
| 7,135,712 | B2 * | 11/2006 | Broer et al. .................. 257/98 |
| 7,235,804 | B2 * | 6/2007 | Aki ............................. 250/551 |
| 7,244,957 | B2 | 7/2007 | Nakajo |
| 7,250,320 | B2 | 7/2007 | Okuyama |
| 7,462,869 | B2 | 12/2008 | Ohashi |
| 7,541,206 | B2 | 6/2009 | Yoon |
| 7,642,562 | B2 | 1/2010 | Kovsh |
| 7,732,802 | B2 | 6/2010 | Cho |
| 7,859,189 | B2 * | 12/2010 | Young ........................ 313/507 |
| 7,893,448 | B2 | 2/2011 | Kim |
| 8,124,991 | B2 | 2/2012 | Iso |
| 8,174,037 | B2 | 5/2012 | Edmond |
| 8,198,645 | B2 | 6/2012 | Saki |
| 8,274,092 | B2 | 9/2012 | Yao |
| 2005/0228231 | A1 * | 10/2005 | MacKinnon et al. ......... 600/180 |
| 2006/0028403 | A1 | 2/2006 | Lee |
| 2006/0091786 | A1 | 5/2006 | Chakraborty |
| 2006/0138434 | A1 | 6/2006 | Summers |
| 2006/0208273 | A1 | 9/2006 | Kang |
| 2006/0284190 | A1 | 12/2006 | Zimmerman |
| 2006/0284195 | A1 | 12/2006 | Nagai |
| 2007/0018184 | A1 | 1/2007 | Beeson |
| 2007/0059852 | A1 | 3/2007 | Miyachi |
| 2007/0091443 | A1 | 4/2007 | Lim |
| 2007/0166851 | A1 | 7/2007 | Tran |
| 2007/0223219 | A1 * | 9/2007 | Medendorp et al. .......... 362/231 |
| 2007/0290215 | A1 * | 12/2007 | Kato et al. .................... 257/79 |
| 2008/0087906 | A1 * | 4/2008 | Murase et al. ................ 257/96 |
| 2008/0218068 | A1 * | 9/2008 | Cok ............................. 313/505 |
| 2008/0272712 | A1 | 11/2008 | Jalink |
| 2008/0283855 | A1 | 11/2008 | Streubel |
| 2012/0018701 | A1 | 1/2012 | Bergmann |

FOREIGN PATENT DOCUMENTS

| | | | | |
|---|---|---|---|---|
| WO | WO-2006090841 | A1 * | 8/2006 | ............ H01L 21/208 |
| WO | 2010/056596 | | 5/2010 | |

OTHER PUBLICATIONS

Chichibu et al., Spontaneous Emission of Localized Excitons in InGaN Single and Multiquantum Well Structures, Appl. Phys. Lett., vol. 69, No. 27, pp. 4188-4190, (Dec. 30, 1996).
Choi et al., Efficient GaN-Based Micro-LED Arrays, Mat. Res. Soc. Symp. Proc., vol. 743, pp. L6.28.1-L6.28-6, (2003).
Choi et al., Fabrication and Performance of Parallel-Addressed InGaN Micro-LED Arrays, IEEE Photonics Technology Letters, vol. 15, No. 4, pp. 510-512, (2003).
Coquillat et al., Studies of the Photonic and Optical-Frequency Phonon Properties of Arrays of Selectively Grown GaN Micropyramids, J. of App. Phys., vol. 103, pp. 044910-1-044910-7 (2008).
Ee et al., Enhancement of Light Extraction Efficiency of InGaN Quantum Wells Light Emitting Diodes Using $SiO_2$/Polystyrene Microlens Arrays, Appl. Phys. Lett., vol. 91, pp. 221107-1-221107-3 (2007).
Gardner et al., Blue-Emitting InGaN-GaN Double-Heterostructure Light-Emitting Diodes Reaching Maximum Quantum Efficiency Above 200A/$cm^2$, Appl. Phys. Lett., vol. 91, pp. 243506-1-243506-3, (2007).
Jin et al., Size Dependence of III-Nitride Microdisk Light-Emitting Diode Charatcteristics, Appl. Phys. Lett., vol. 78, No. 22, pp. 3532-3534, (May 28, 2001).
Kim et al., Effect of GaN Microlens Array on Efficiency of GaN-Based Blue-Light-Emitting-Diodes, Jpn. J. of App. Phys., vol. 44, No. 1, pp. L18-L20, (2005).
Kim et al., A Fabrication of GaN Micro-Lens, Digest of the IEEE/Leos Summer Topical Meetings, Vertical-Cavity Lasers, pp. 54-55, (Aug. 11-13, 1997). (XP002293923).
Lee, Electrode Design for InGaN/Sapphire LED'S Based on Multiple Thin Ohmic Metal Patches, Proc. of SPIE, vol. 5530, pp. 338-346, (2004).
Miyake et al., Blue Emission From InGaN/GaN Hexagonal Pyramid Structures, Superlattices and Microstructures, vol. 41, pp. 341-346 (2007).
Nakamura et al., InGaN/AlGaN Blue-Light-Emitting Diodes, J. Vac. Sci. Technol., vol. A 13, No. 3, pp. 705-710, (May/Jun. 1995).
Nakamura et al., Superbright Green InGaN Single-Quantum-Well-Structure Light-Emitting Diodes, Jpn. J. Appl. Phys., vol. 34, Part 2, No. 10B, pp. L1332-L1335, (Oct. 15, 1995).
Oder et al., Nitride Microlens Arrays for Blue and Ultraviolet Wavelength Applications, Appl. Phys. Lett., vol. 82, No. 21, pp. 3692-3694 (May 26, 2003).
Schubert, Light Emitting Diodes, Cambridge University Press, Cambrige, United Kingdom, 2006.
Shen et al., Optical Cavity Effects in InGaN Quantum-Well-Heterostructure Flip-Chip Light-Emitting Diodes, App. Phys. Lett., vol. 82, No. 14, pp. 2221-2223, (Apr. 7, 2003).
Sze, Physics of Semiconductor Devices, John Wiley and Sons, 5 pages, (1981).
Tong, Q-Y and Gosele, U., "Surface Preparation and Room-Temperature Wafer Bonding" and "Bonding of Structured Wafers", Semiconductor Wafer Bonding, John Wiley & Sons, New York, Chapters 4 and 10, pp. 49-101 and pp. 223-232, (1999).
Search Report for International Application No. PCTUS/2009/055885, Date of Mailing Apr. 12, 2010, 2 pages.
Written Opinion for International Application No. PCTUS/2009/055885, Date of Mailing Apr. 12, 2010, 5 pages.

* cited by examiner

US 8,754,425 B2

ELECTRICALLY PIXELATED LUMINESCENT DEVICE

CROSS REFERENCE TO RELATED APPLICATIONS

This application is a national stage filing under 35 U.S.C. 371 of PCT/US2009/055885, filed Sep. 3, 2009, which claims priority to U.S. Provisional Application No. 61/095,205, filed Sep. 8, 2008, the disclosure of which is incorporated by reference in its/their entirety herein.

FIELD OF INVENTION

The described invention relates to light emitting systems. In particular the invention relates to electrically pixelated luminescent devices.

SUMMARY

In one aspect, the present disclosure provides an electrically driven pixelated lumination device (EPLD). The EPLD may comprise a p-layer having a p-layer electrode surface and a p-layer interface surface, an n-layer having an n-layer electrode surface and an n-layer interface surface, and a continuous light emitter region disposed between the n-layer interface surface and the p-layer interface surface. The EPLD may further comprise at least one p-layer electrode and at least one n-layer electrode. At least one of the p-layer electrode or n-layer electrode comprises a plurality of individually addressable electrodes.

In another aspect, the present description provides an EPLD comprising an outer semiconductor layer comprising a light emission face that comprises a common electrode and an inner semiconductor layer comprising a non-emission face that comprises a plurality of individually addressable electrodes. The EPLD also comprises a continuous light emitter region disposed between the outer semiconductor layer and the inner semiconductor layer.

In yet another aspect, the present description provides a method for generating pixelated light comprising electrically addressing at least two of a plurality of individually addressable electrodes of an EPLD. The EPLD comprises an outer semiconductor layer comprising a light emission face that comprises a common electrode and an inner semiconductor layer comprising a non-emission face that comprises a plurality of individually addressable electrodes. The EPLD also comprises a continuous light emitter region disposed between the outer semiconductor layer and the inner semiconductor layer.

In a further aspect, the present description provides a pixelated light emitting system. The pixelated light emitting system may comprise an outer semiconductor layer comprising a light emission face that comprises a common electrode, an inner semiconductor layer comprising a non-emission face that comprises a plurality of individually addressable electrodes, and a continuous light emitting region disposed between the outer semiconductor layer and the inner semiconductor layer. The pixelated light emitting system may further comprise a circuit for supplying current to each of the individually addressable electrodes wherein when each of the individually addressable electrodes is addressed the pixelated light emitting system emits a spatially unique pattern of light.

The present description provides, in another aspect, an optical system comprising a pixelated light emitting system and a pixelated spatial light modulator for receiving light emitted by the pixelated light emitting system. The pixelated light emitting system may comprise an outer semiconductor layer comprising a light emission face that comprises a common electrode, an inner semiconductor layer comprising a non-emission face that comprises a plurality of individually addressable electrodes, and a continuous light emitting region disposed between the outer semiconductor layer and the inner semiconductor layer. The pixelated light emitting system may further comprise a circuit for supplying current to each of the individually addressable electrodes wherein when each of the individually addressable electrodes is addressed the pixelated light emitting system emits a spatially unique pattern of light.

In another aspect, the present description provides an image forming device comprising an outer semiconductor layer comprising a light emission face that comprises a common electrode, an inner semiconductor layer comprising a non-emission face that comprises a plurality of individually addressable electrodes defining pixels, and a continuous light emitting region disposed between the outer semiconductor layer and the inner semiconductor layer. The image forming device may further comprise a dedicated switching circuit for controlling an output light from each pixel.

BRIEF DESCRIPTION OF DRAWINGS

The description may be more completely understood and appreciated in consideration of the following detailed description of various embodiments in connection with the accompanying drawings, in which.

DETAILED DESCRIPTION

Figure 1:
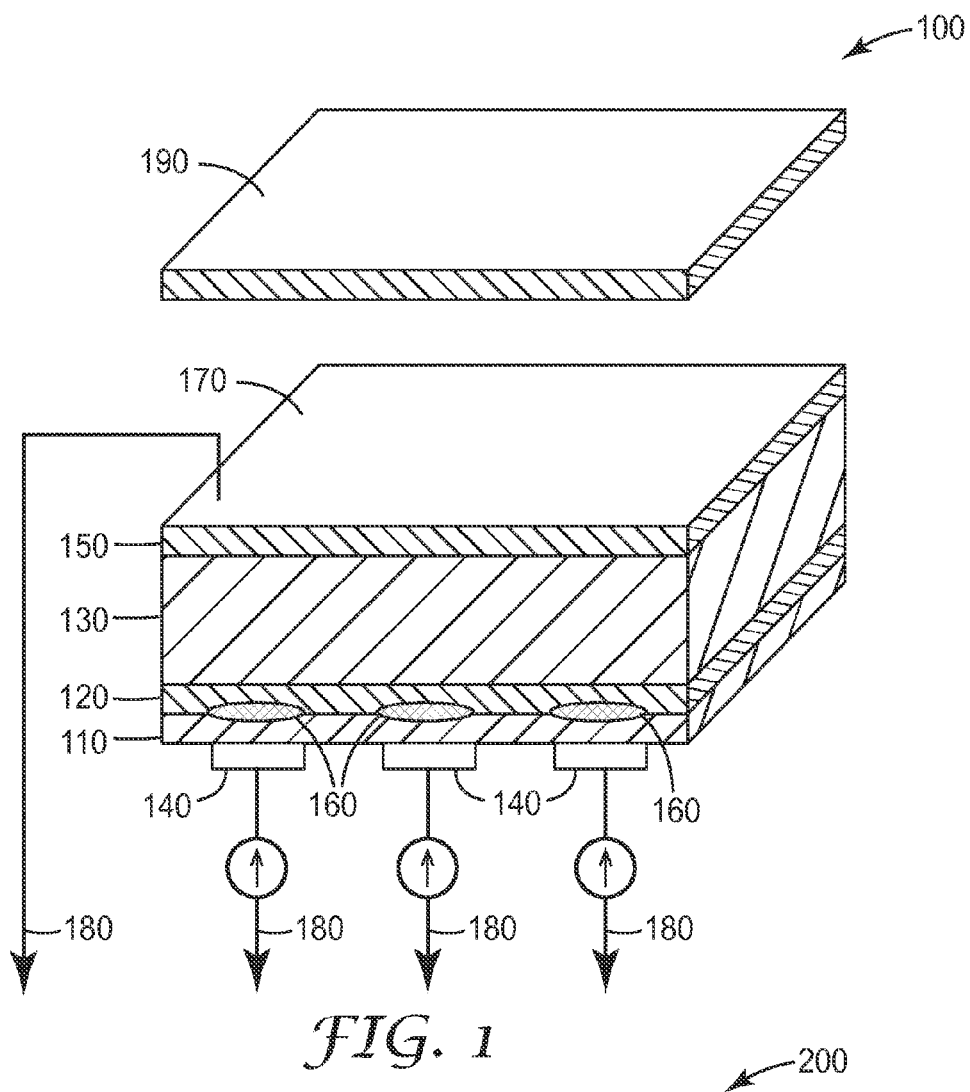
FIG. 1 is a cross-sectional view of a pixelated luminescent (PLD) device.

Pixelated luminescent devices (PLDs), in particular pixelated electroluminescent devices, may be useful in a number of applications, such as in displays, as a light source, for projector illumination, in sensors (e.g., biological sensors), and for digital signage. Display applications include, for instance, backlighting for a light valve imager (e.g., transmissive LCD imagers), as well as serving as an imager for direct projection (e.g., pico-projector, portable projectors, rear projection television, and icon/pointer projection). For projector illumination applications, pixelated luminescent devices such as those described herein may provide short mixing distances. Light source applications include, for instance, solid state lighting (e.g., architectural lighting).

In one aspect, the electrically pixelated luminescent devices (EPLDs) described herein differ from physically pixelated arrays of luminescent elements in that the light emitter region in the EPLDs described herein is continuous. That is, arrays of luminescent elements typically require physical discontinuity between elements, in particular physical discontinuity of the light emitter region. In contrast, the individually addressable electrodes, in combination with the continuous light emitter region in the EPLDs described herein, give rise to a luminescent device that is electrically, as compared to physically, pixelated.

The process for producing physically pixelated arrays (for instance by etching through light emitting diode materials such as GaN) may be expensive and tedious and requires substantial capital investment. Additionally, there are limits for spatial resolution for physically pixelated arrays that depend upon the structural integrity of the LED material, the capabilities of the etching equipment, or both. Further, physically pixelated arrays of LEDs may be inefficient in transporting heat created upon activation due to their independent thermal pathways. In contrast, the EPLDs described herein may allow for lower cost and higher resolution, as well as providing better heat-spreading ability. Furthermore, physical pixelation may lead to growth of threading dislocations. If one assumes a 2 µm square pixel dimension, then an average defect density of $4 \times 10^8$ defects/$cm^2$ will mean that, on average, there will be 1 defect per pixel and it is statistically possible for some pixels to have several defects while others have none. Any pixel having too many defects through the active region may not emit light as efficiently as the other pixels, or may even not emit light at all. In order to achieve a desired low level of defective pixels, it may be advantageous to use semiconductor materials that are fabricated with low defect density equal to, or less than, the pixel density.

The EPLDs described herein are based on light emitting diodes. The physics of semiconductor diode junctions and light emitting diodes will be described here only briefly. For a more complete description see, for example, E. F. Schubert, *Light Emitting Diodes*, 2006; and S. M. Sze, *Physics of Semiconductor Devices*, 1981.

A semiconductor is a material with electrical conductivity between that of a metal and an insulator. The electronic properties of semiconductors derive from the presence of a bandgap between the valence band and the conduction band. In order for the semiconductor to carry a current, an electron must move from the valence band to the conduction band. At room temperature in a pure semiconductor, very few electrons are present in the conduction band. A pure (intrinsic) semiconductor is generally an insulator. The addition of small quantities (typically <1 at. %) of appropriate dopant atoms, however, will significantly increase the conductivity at room temperature. The presence of the dopant atoms provides free carriers that can carry the flow of electricity in the semiconductor. Depending on the semiconductor and the type of dopant, the dominant charge carrier will be either electrons that are added to the conduction band or holes that are created in the valence band (a hole is the absence of an electron in an otherwise filled band). Dopants that provide electrons are known as "donors" while dopants that create holes are known as "acceptors". An "n-type" semiconductor has been doped with donors and a "p-type" semiconductor has been doped with acceptors.

A diode is formed when a p-type and n-type semiconductor are placed in electrical contact. The contact interface between the p- and n-type semiconductors is called the diode junction. A diode has the property that it will allow electrical current to flow in one direction through the diode junction with very little apparent resistance. Current will flow through the diode when it is biased (i.e., connected to an external voltage) in a way that provides electrons to the n-type side of the junction and removes electrons from the p-type side of the junction. This condition is known as operating the diode under "forward bias". When operated under the opposite bias ("reverse bias") the diode has much higher resistance and only a very small leakage of current will flow through the junction.

A light-emitting diode is a type of diode that emits light when it is operated with a forward bias. Light emission occurs when an electron from the n-type semiconductor recombines with a hole from the p-type semiconductor. The electron from the conduction band fills the hole in the valence band and the electron emits the energy difference between the conduction and valence bands as either a photon of light (radiative recombination) and/or as heat (non-radiative recombination). Generally, recombination is most likely to occur near the junction. Recombination in some semiconductors produces almost no light, but in others, an appreciable amount of light is emitted. Examples of semiconductors that have been used to make light emitting diodes include: GaAs, AlGaAs, InGaAs, InGaAlP, GaN, AlGaN, InGaN, ZnSe, CdZnSe, ZnO, and SiC.

The efficiency of the EPLDs described herein may be greater than physically pixelated devices. For instance, the minority hole diffusion length in GaN has been reported to be around 1 µm. Thus, a 2 µm pixel will suffer significant efficiency loss from surface recombination, which provides an additional non-radiative recombination pathway for carriers in the active layer within about the diffusion length of the surface. While there are methods for reducing surface recombination in physically pixelated devices (e.g., providing a surface layer or surface treatment that passivates the surface states and reduces the likelihood of surface recombinations), such methods increase the costs and complexity of manufacturing. The EPLDs of the present description eliminate such surface recombination by not etching through the active layer, therefore not forming the surfaces on which such inefficient recombinations occur. In one embodiment of the EPLDs described herein, the p-type layer may be etched partially or completely without etching the active layer. As used herein "partially etched" means etched through some part of the thickness without etching through the entire thickness of a layer. "Completely etched" means etched through the entire thickness of a layer. This p-type layer etching increases the sheet resistance of the p-type layer in the etched regions and further reduces current spreading. This method can be used to improve current confinement in a thicker or more highly doped p-type layer. Etching the p-type layer does not introduce surface states in the active region, so it will not cause the surface recombination that complete physical pixelation introduces. The p-layer electrode contact metal may be used as a self-aligned mask making the fabrication step for partially or fully etching the p-type layer.

Without wishing to be bound by theory, it is believed that in addition to this inefficiency, surface recombination may also increase the diode ideality value. See, for instance, Jin, *Appl. Phys. Lett.* 78, 22. The current spreading length is proportional to the diode ideality value. Therefore, physical pixelation may also increase the spreading length for a given device. This loss of current control (and thus loss in contrast) may be mitigated in the EPLDs described herein vis á vis physically pixelated devices.

A diode can be generally classified by the nature of the junction layer. The simplest type of junction is a homo-junction, which is formed between n- and p-type regions in the same semiconductor material. The composition of the semiconductor (and therefore the bandgap) is the same across a homo-junction with only the dopant type and concentration varied. A junction between two semiconductors with different compositions and different dopant types and concentrations is a hetero junction (for example, a junction between GaAs and AlGaAs). A double-heterojunction (DH), also known as double-heterostructure, diode is made of two adjacent heterojunctions. An example of a double-heterostructure is a 100 nm thick $In_{0.06}Ga_{0.94}N$ layer (i.e., the intermediate layer) between n-type $Al_{0.15}Ga_{0.85}N$ and p-type $Al_{0.15}Ga_{0.85}N$, described in Nakamura, *J. Vac. Sci. Technol. A* 13, 705. The bandgap of the intermediate material in a double-heterojunction determines the wavelength of the emitted light.

Diode junctions may also include a single-quantum-well (SQW) or multiple-quantum-wells (MQW) between the p- and n-type semiconductors that form the junction. A quantum well is a thin layer of semiconductor (usually undoped) sandwiched between barrier layers of semiconductors (which may be adjacent or immediately adjacent [e.g., in physical contact]), with a smaller bandgap for the quantum wells than for the adjacent layers. As used herein, the term adjacent is broader than and subsumes the term immediately adjacent. Electrons and holes injected into the quantum well are confined and are more likely to recombine radiatively. In addition, the band gap energy of the quantum well is determined by the thickness of the quantum well and also by the composition of the semiconductors in the well and on either side of the well. The energy of light emitted can be controlled by adjusting the layer thickness during growth of the device and by choosing the composition of the quantum well layers. An example of a single quantum well structure is 3 nm thick $In_{0.45}Ga_{0.55}N$ between n-type GaN and p-type $Al_{0.2}Ga_{0.8}N$ described in Nakamura, *Jpn. J. Appl. Phys.* 34, L1332. An example of a multiple quantum well structure is ten periods of 2.5 nm thick $In_{0.2}Ga_{0.8}N$ wells and 7.5 nm thick $In_{0.05}Ga_{0.95}N$ barriers between n-type GaN and p-type GaN layers as described in Chichibu, *Appl. Phys. Lett.* 69, 30.

Junction designs that have reduced current droop (such as the type described in Gardner, N. F., *Appl. Phys. Lett.* 91, 243506.) could be used to increase the efficiency of an EPLD.

FIG. 1 is a cross-sectional view of an electrically pixelated luminescent device (EPLD). In this embodiment, light emitting diode (LED) device 100 is provided having continuous light emitter region 120 disposed between p-doped layer 110 and n-doped layer 130. The emission face of LED device 100 comprises n-layer electrode 150. Disposed on p-doped layer 110 is a plurality of individually addressable electrodes 140.

Upon supplying current to any of the individually addressable electrodes 140, light is created in continuous light emitter region 120 at light creation region 160. The light created at light creation region 160 is then emitted from emission face 170. Of course, light may also be emitted through the face comprising the plurality of individually addressable electrodes and/or may be waveguided in the LED layers. In such instances, the extraction efficiency of light from the EPLD may be enhanced by such methods as putting a reflective coating or reflective material on the EPLD on the face comprising the plurality of individually addressable electrodes. In this embodiment, the n-doped layer is located proximate the emission face and thus may be referred to as an outer semiconductor layer. The p-doped layer, positioned on the side of the active region distal to the emission face, would in this embodiment be referred to as an inner semiconductor layer. The ability to individually address individually addressable electrodes 140 allows for the creation of unique spatial light output profiles for different voltage inputs. Such spatial control of the light output by electrical pixelation may be useful in applications where light emission is imaged, such as in a projection device. Spatial control of the light output by electrical pixelation may also be useful in applications where the light is angularly directed, such as when delivered to a lens or other optic that translates light emission position into light output direction.

For the sake of simplicity, FIG. 1 shows light creation region 160 as a non-overlapping oval that is symmetric about the center line of individually addressable electrodes 140. In operation, however, the shape of light creation region 160 may be any shape and may be symmetric or asymmetric about the center line of individually addressable electrodes 140. Further, adjacent light creation regions 160 may spatially overlap.

Continuous light emitter region 120 is disposed between p-doped layer 110 and n-doped layer 130. When a potential is applied between an individually addressable electrode 140 and n-layer electrode 150, holes flow from the individually addressable electrode, through the p-doped layer 110 and into light emitter region 120 and electrons flow from the n-layer electrode 150, through the n-doped layer 130 and into the light emitter region 120. In the light emitter region 120, electrons and holes may recombine and produce light which may be in the visible region, the infrared region, or the ultraviolet region.

Continuous light emitter region 120 may be any suitable structure, including, for instance, a single quantum well, a multiple quantum well, a homojunction, a heterojunction, a double heterojunction, and the like. The layer may be comprised of, for example, alternating sub-layers of GaN and InGaN. Alternating the two materials in, e.g. a multiple quantum well, creates a bandgap corresponding to a particular emission wavelength. It could also be comprised of, for example, a single layer of epitaxially grown GaN or InGaN. Other suitable materials for the continuous light emitter region may include, but are not limited to, silicon (Si), germanium (Ge), aluminum gallium nitride (AlGaN), indium nitride (InN), aluminum indium gallium nitride (AlInGaN), aluminum gallium indium phosphide (AlGaInP), indium gallium phosphide (InGaP), gallium arsenide (GaAs), indium gallium arsenide (InGaAs), indium gallium arsenide phosphide (InGaAsP), zinc oxide (ZnO), zinc sulfide (ZnS), cadmium sulfide (CdS), cadmium selenide (CdSe), cadmium telluride (CdTe) and mercury cadmium telluride (HgCdTe).

In some embodiments, it may be advantageous to select approximately lattice matched semiconductors for the p-type layer, the n-type layer, and the continuous light emitter region. This may be achieved, for instance, by building the EPLD on entirely the same semiconductor family. Appropriate semiconductor families include Group IV semiconductors, III-V semiconductors, and II-VI semiconductors. All binary, ternary, or quaternary alloys based on group IV, group III-V or group II-VI semiconductors are permitted. Thus, while throughout this specification specific semiconductor materials are described as suitable for the n-type semiconductor layer, the p-type semiconductor layer, and/or the continuous light emitter region, it should be understood that the particular materials chosen are not limited to those specifically enumerated and instead the choice of materials should be guided by the entirety of the description, including the selection of approximately lattice matched materials.

Figure 3:
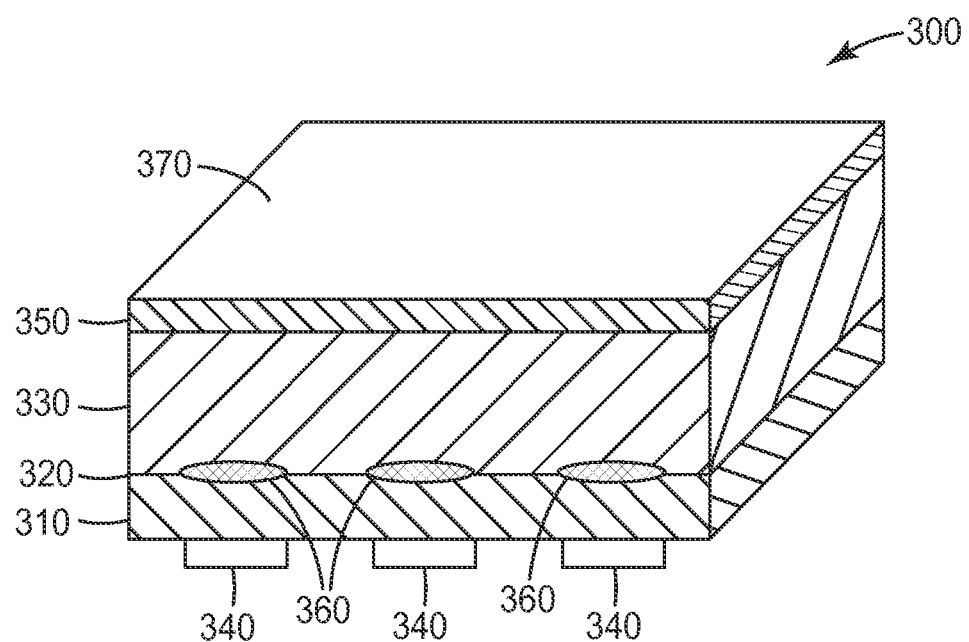
FIG. 3 is a cross-sectional view of a PLD device.

In another embodiment, as shown in FIG. 3 and discussed below in more detail, the continuous light emitter region may correspond to a heterojunction, in which the p-doped layer and n-doped layer are in direct contact with one another. While a single heterojunction is described herein, a double-heterojunction is also contemplated, such as one in which the diode comprises two adjacent heterojunctions. Such structures include, for instance, those in which the n-type and p-type layers comprise the same or different materials and each are in contact with an intermediate layer that is different than both the n-type and p-type layer material.

In FIG. 1, p-doped layer 110 is in contact with individually addressable electrodes 140 and continuous light emitter region 120. Typically, the individually addressable electrodes 140 will be deposited onto the p-doped layer 110 by, for example, e-beam evaporation. Metals used for contacts for both the p-type layer and/or the n-type layer may be selected from, for instance, Au, Ag, TI, Au/Ti, Au/In, Au/Ni, and Cu.

For each of the EPLDs described herein, an annealing step after the deposition may be used to reduce the contact resistance between the individually addressable electrodes (e.g., 140) and the p-doped layer (e.g., 110). When the contact resistance of the p-contact is kept as low as possible, the operating voltage of the pixel may be reduced and thus the efficiency of the system increased. High contact resistance may lead to ohmic heating which can waste energy and lower the efficiency of the EPLD device at the diode junction by increasing the operating temperature. Ohmic heating may also decrease the lifetime of an LED device, particularly a physically pixelated LED device unable to effectively dissipate such heat, by increasing the rate of growth of threading dislocations.

Figure 2:
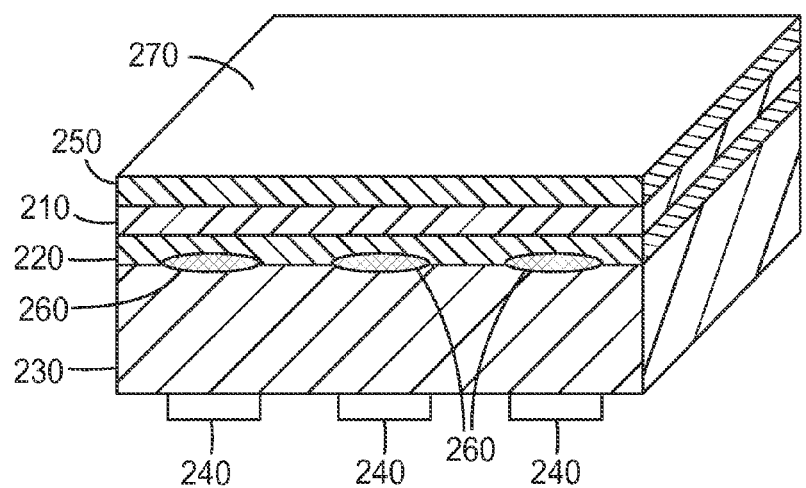
FIG. 2 is a cross-sectional view of a PLD device.

Further, for each of the EPLDs described herein, having a small p-contact (whether the p-type layer is as shown in FIG. 1 or FIG. 2), will help to confine the current to the portion of the active region directly above the p-contact. Some current spreading will occur in the EPLDs described herein, and the current will flow through a region of the active region that is larger than the p-contact. Thus, when the p-contact is smaller than the desired pixel size, the contrast is improved by minimizing the spread of current to adjacent pixels, which can, in part, be accomplished by using small p-contacts.

Light output may also be increased by making the p-contact layer reflective. The insulating area around the p-contact may also be reflective by using a dielectric stack mirror or by depositing a thin insulator around the p-contact and then coating a reflective metal (which may be the same as the p-contact metal) over the insulator (of course, taking care not to short out the individually addressable electrodes).

P-doped layer 110 may be any suitable LED material, such as Mg-doped GaN. Other suitable materials include p-doped silicon (Si), germanium (Ge), aluminum gallium nitride (AlGaN), indium gallium nitride (InGaN), indium nitride (InN), aluminum indium gallium nitride (AlInGaN), aluminum gallium indium phosphide (AlGaInP), indium gallium phosphide (InGaP), gallium arsenide (GaAs), indium gallium arsenide (InGaAs), indium gallium arsenide phosphide (InGaAsP), zinc oxide (ZnO), zinc sulfide (ZnS), cadmium sulfide (CdS), cadmium selenide (CdSe), cadmium telluride (CdTe) and mercury cadmium telluride (HgCdTe).

In FIG. 1, n-doped layer 130 is in contact with continuous light emitter region 120 and n-layer electrode 150. Typically, the n-layer electrode 150 will be deposited onto n-doped layer 130 by, for example, e-beam evaporation. As noted above, metals used for contacts for the p-type layer and/or the n-type layer may be selected from, for instance, Au, Ag, Ti, Au/Ti, Au/In, Au/Ni, and Cu. An annealing step after the deposition may be used to reduce the contact resistance between the n-layer electrode 150 and the n-doped layer 130. N-doped layer 130 may be any suitable LED material, such as Si-doped GaN. Other suitable materials include, but not limited to n-doped silicon (Si), germanium (Ge), aluminum gallium nitride (AlGaN), indium gallium nitride (InGaN), indium nitride (InN), aluminum indium gallium nitride (AlInGaN), aluminum gallium indium phosphide (AlGaInP), indium gallium phosphide (InGaP), gallium arsenide (GaAs), indium gallium arsenide (InGaAs), indium gallium arsenide phosphide (InGaAsP), zinc oxide (ZnO), zinc sulfide (ZnS), cadmium sulfide (CdS), cadmium selenide (CdSe), cadmium telluride (CdTe) and mercury cadmium telluride (HgCdTe).

The sheet resistivity of the p-doped layer 110 has a large influence on the current spreading in an ELPD. A p-doped layer with higher sheet resistivity will have less spreading than a p-doped layer with lower sheet resistivity. The sheet resistance, $R_s$, of the p-doped layer is calculated from the bulk resistivity, $\rho$, of the p-doped material and the thickness, t, of the p-doped layer.

$$R_s = \frac{\rho}{t}$$

The diode ideality factor also influences the current spreading, however this is a more difficult parameter to control and will depend on the type of semiconductor and the growth conditions, among other factors.

In, for instance, GaN semiconductors, the majority of current spreading occurs in the p-type layer. Making this layer thinner will increase sheet resistivity and therefore reduce current spreading. In some embodiments, it is advantageous to avoid making the p-type layer thinner than the depletion layer width in the p-type layer. Further, a low doping concentration in the p-type layer increases the resistance and reduces the current spreading. A low doping concentration also increases the depletion width, however, so consideration must be given to both the thickness of the p-type layer and the doping concentration. The resistance from low doping concentrations increases faster than the depletion width. Accordingly, a p-type layer having low doping concentration will be more resistive than a highly doped p-type layer, even if the lower doping layer requires a thicker layer in order to be thicker than the depletion layer width.

The cavity effect can increase light output and also provide collimation of the light inside the high-index structures which may also reduce light spreading. The cavity effect is accentuated when the light emitting area is located at a specific distance from the p-contact metal, so the p-type layer should be made the correct thickness to maximize this effect. See for example the description by Y. C. Chen et al. Applied Physics Letters, 82, 2221 (2003). The thickness of the p-type layer can be set to the desired value for maximizing the cavity effect and the doping level of the p-type layer can be adjusted to achieve the desired sheet resistivity to minimize current spreading In some cases the distance between the light emitting area and the p-contact metal is between about 0.6 and 0.8 times or about 1.2 times the emitting wavelength in the material.

FIG. 2 is a cross-sectional view of a second EPLD device. In this embodiment, LED device 200 has continuous light emitter region 220. Again, the light emitter region 220 is disposed between p-doped layer 210 and n-doped layer 230. Unlike in FIG. 1, in this embodiment, n-doped layer 230 is the inner semiconductor layer and p-doped layer 210 is the outer semiconductor layer. As shown in FIG. 2, n-doped layer 230 is disposed between the light emitter region 220 and individually addressable electrodes 240. P-doped layer 210 is disposed proximate to p-layer electroded 250, such that light created in light creation region 260 travels through the p-doped layer 210 en route to emission face 270 atop the p-layer electroded 250. This embodiment illustrates the ability for either the n-doped or p-doped layer to serve as the outer semiconductor layer, as desired.

Continuous light emitter region 220 is disposed between p-doped layer 210 and n-doped layer 230. When a potential is applied between an individually addressable electrode 240 and p-layer electroded 250, holes flow from the p-layer electroded 250 through the p-doped layer 210 and into light emitter region 220 and electrons flow from individually addressable electrode 240, through the n-doped layer 230 and into the light emitter region 220. In the light emitter region 220, electrons and holes may recombine and produce light which may be in the visible region, the infrared region, or the ultraviolet region.

Continuous light emitter region 220 may be any suitable structure, including, for instance, a single quantum well, a multiple quantum well, a homojunction, a heterojunction, a double heterojunction, and the like. The layer may be comprised of, for example, alternating sub-layers of GaN and InGaN. Alternating the two materials in, e.g. a multiple quantum well, creates a bandgap corresponding to a particular emission wavelength. It could also be comprised of, for example, a single layer of epitaxially grown GaN or InGaN. Other suitable materials for the continuous light emitter region may include, but are not limited to, silicon (Si), germanium (Ge), aluminum gallium nitride (AlGaN), indium nitride (InN), aluminum indium gallium nitride (AlInGaN), aluminum gallium indium phosphide (AlGaInP), indium gallium phosphide (InGaP), gallium arsenide (GaAs), indium gallium arsenide (InGaAs), indium gallium arsenide phosphide (InGaAsP), zinc oxide (ZnO), zinc sulfide (ZnS), cadmium sulfide (CdS), cadmium selenide (CdSe), cadmium telluride (CdTe) and mercury cadmium telluride (HgCdTe).

In FIG. 2, n-doped layer 230 is in contact with individually addressable electrodes 240 and continuous light emitter region 220. Typically, the individually addressable electrodes 240 will be deposited onto the n-doped layer 210 by, for example, e-beam evaporation.

For the sake of simplicity, FIG. 2 shows light creation region 260 as a non-overlapping oval that is symmetric about the center line of individually addressable electrodes 240. In operation, however, the shape of light creation region 260 may be any shape and may be symmetric or asymmetric about the center line of individually addressable electrodes 240. Further, adjacent light creation regions 260 may spatially overlap.

N-doped layer 230 may be any suitable LED material, such as Si-doped GaN. Other suitable materials include silicon (Si), germanium (Ge), aluminum gallium nitride (AlGaN), indium gallium nitride (InGaN), indium nitride (InN), aluminum indium gallium nitride (AlInGaN), aluminum gallium indium phosphide (AlGaInP), indium gallium phosphide (InGaP), gallium arsenide (GaAs), indium gallium arsenide (InGaAs), indium gallium arsenide phosphide (InGaAsP), zinc oxide (ZnO), zinc sulfide (ZnS), cadmium sulfide (CdS), cadmium selenide (CdSe), cadmium telluride (CdTe) and mercury cadmium telluride (HgCdTe).

In FIG. 2, p-doped layer 210 is in contact with continuous light emitter region 220 and p-layer electroded 250. Typically, the p-layer electroded 250 will be deposited onto p-doped layer 210 by, for example, e-beam evaporation. An annealing step after the deposition may be used to reduce the contact resistance between the p-layer electroded 250 and the p-doped layer 210. P-doped layer 210 may be any suitable LED material, such as Mg-doped GaN. Other suitable materials include, but not limited to silicon (Si), germanium (Ge), aluminum gallium nitride (AlGaN), indium gallium nitride (InGaN), indium nitride (InN), aluminum indium gallium nitride (AlInGaN), aluminum gallium indium phosphide (AlGaInP), indium gallium phosphide (InGaP), gallium arsenide (GaAs), indium gallium arsenide (InGaAs), indium gallium arsenide phosphide (InGaAsP), zinc oxide (ZnO), zinc sulfide (ZnS), cadmium sulfide (CdS), cadmium selenide (CdSe), cadmium telluride (CdTe) and mercury cadmium telluride (HgCdTe).

FIG. 3 is a cross-sectional view of another EPLD. This embodiment illustrates LED device 300, comprising p-doped layer 310 and n-doped layer 330. Emission face 370 of LED device 300 comprises n-layer electrode 350. Disposed on p-doped layer 310 are individually addressable electrodes 340. In this embodiment, light emitter region 320 is not a separate layer of material, but rather is a diode junction. The diode junction may be a homojunction if the n- and p-type regions are made of the same semiconductor material with only the dopant type and concentration of the dopant material varied. The diode junction between may be a heterojunction in which p-doped layer 310 and n-doped layer 330 are different compositions and different dopant types and concentrations are used (for example, a junction between GaAs and AlGaAs). A double-heterojunction (not shown), also known as double-heterostructure, diode is also contemplated which comprises two adjacent heterojunctions. An example of a double-heterostructure may be a 100 nm thick $In_{0.06}Ga_{0.94}N$ layer (i.e., the intermediate layer) between n-type $Al_{0.15}Ga_{0.85}N$ and $Al_{0.15}Ga_{0.85}N$. The bandgap of the intermediate material in a double-heterojunction determines the wavelength of the emitted light.

Continuous light emitter region 320 is disposed between p-doped layer 310 and n-doped layer 330. When a potential is applied between an individually addressable electrode 340 and p-layer electrode 350, holes flow from the p-layer electrode 350 through the p-doped layer 310 and into light emitter region 320 and electrons flow from individually addressable electrode 340, through the n-doped layer 330 and into the light emitter region 320. In the light emitter region 320, electrons and holes may recombine and produce light which may be in the visible region, the infrared region, or the ultraviolet region.

In this embodiment, n-doped layer 330 is located proximate the emission face and thus may be referred to as an outer semiconductor layer. P-doped layer 310, positioned on the side of continuous light emitter region 320 distal to the emission face, would in this embodiment be referred to as an inner semiconductor layer. The ability to individually address individually addressable electrodes 340 allows for the creation of unique spatial light output profiles for different voltage inputs. Such spatial control of the light output by electrical pixelation may be useful in applications where light emission is imaged, such as in a projection device. Spatial control of the light output by electrical pixelation may also be useful in applications where the light is angularly directed, such as when delivered to a lens or other optic that translates light emission position into light output direction.

For the sake of simplicity, FIG. 3 shows light creation region 360 as a non-overlapping oval that is symmetric about the center line of individually addressable electrodes 340. In operation, however, the shape of light creation region 360 may be any shape and may be symmetric or asymmetric about the center line of individually addressable electrodes 340. Further, adjacent light creation regions 360 may spatially overlap.

Continuous light emitter region 320 is the shown as a diode junction between p-doped layer 310 and n-doped layer 330.

P-doped layer 310 may be any suitable LED material, such as Mg-doped GaN. Other suitable materials include silicon (Si), germanium (Ge), aluminum gallium nitride (AlGaN), indium gallium nitride (InGaN), indium nitride (InN), aluminum indium gallium nitride (AlInGaN), aluminum gallium indium phosphide (AlGaInP), indium gallium phosphide (InGaP), gallium arsenide (GaAs), indium gallium arsenide (InGaAs), indium gallium arsenide phosphide (InGaAsP), zinc oxide (ZnO), zinc sulfide (ZnS), cadmium sulfide (CdS), cadmium selenide (CdSe), cadmium telluride (CdTe) and mercury cadmium telluride (HgCdTe).

In FIG. 3, n-doped layer 330 is in contact with continuous light emitter region 320 and n-layer electrode 350. Typically, the n-layer electrode 350 will be deposited onto n-doped layer 330 by, for example, e-beam evaporation. An annealing step after the deposition may be used to reduce the contact resistance between the n-layer electrode 350 and the n-doped layer 330. N-doped layer 330 may be any suitable LED material, such as Si-doped GaN. Other suitable materials include, but not limited to silicon (Si), germanium (Ge), aluminum gallium nitride (AlGaN), indium gallium nitride (InGaN), indium nitride (InN), aluminum indium gallium nitride (AlInGaN), aluminum gallium indium phosphide (AlGaInP), indium gallium phosphide (InGaP), gallium arsenide (GaAs), indium gallium arsenide (InGaAs), indium gallium arsenide phosphide (InGaAsP), zinc oxide (ZnO), zinc sulfide (ZnS), cadmium sulfide (CdS), cadmium selenide (CdSe), cadmium telluride (CdTe) and mercury cadmium telluride (HgCdTe).

While FIGS. 1-3 show embodiments wherein the individually addressable electrodes are attached to the surface distal to the emission face in the EPLD, it will be understood that the light emission face and the face comprising the plurality of individually addressable electrodes may be the same. Such an embodiment may provide an emission surface in closer physical proximity to the light emitter region in an EPLD (owing to a thinner p-type layer, for instance). Further, the circuitry for individually addressing the individually addressable electrodes may act as a mask, providing some optical separation between the electrically pixelated pixels. In such an embodiment, it may further be desirable to add a reflective layer to the non-emission face to increase the light output by redirecting light that is generated in the light emitter region but that is initially directed to the non-emission face.

FIGS. 4a through 4h provide a step-by-step illustration of one embodiment of a process for fabricating an EPLD according to the present description.

First, un-doped buffer layer 470 is grown on substrate, 480. Such growth may be accomplished by any suitable method, including metallo-organic chemical vapor deposition (MOCVD), hydride vapor phase epitaxy (HVPE), metallo-organic vapor phase epitaxy (MOVPE), metallo-organic molecular beam epitaxy (MOMBE), and atomic layer deposition (ALD). If a native nitride substrate is used, the growth of a buffer layer may not be necessary.

Substrate 480 may be any suitable materials, such as sapphire, SiC, ZnO, LiAlO$_2$, AlN or GaN. A typical substrate thickness is around 0.5 mm thick, but the thickness may be chosen based upon ease of handling, cost, or other factors.

A thin low temperature GaN seed layer is often deposited on the substrate before the subsequent layers are epitaxially grown.

Un-doped buffer layer 470 may be any suitable material selected based upon the material used for substrate 480 and on the type of materials used in the remainder of the LED. For instance, un-doped GaN may be a suitable material for un-doped buffer layer 470. A typical thickness of an undoped GaN buffer layer is around 2 μm.

Figure 4A:
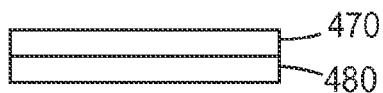
FIGS. 4a-4h are schematic representations of devices at various stages or steps in a process for fabricating an PLD device.
Figure 4B:

In FIG. 4b, n-doped layer 430 is grown on un-doped buffer layer 470. Suitable materials and deposition methods are those described throughout this description for n-type layers. A typical thickness of an n-doped layer is around 2 μm thick.

Figure 4C:
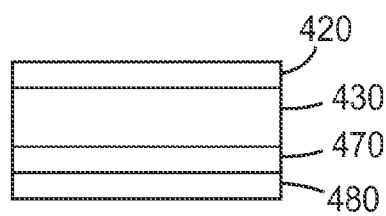

In FIG. 4c, quantum well layer 420 (single or double quantum well) is grown on n-doped layer 430. Si-doping can be used to produce n-type GaN. A typical total layer thickness for the quantum wells and barrier layers is in the range of 40 to 100 nm.

It is understood in the art that the term quantum well refers to a potential well that confines particles in two dimensions (in this case electrons and/or holes), which were originally free to move in three dimensions, forcing them to occupy a planar region (so-called quantum confinement). The effects of quantum confinement take place when the quantum well thickness becomes comparable at the de Broglie wavelength of the carriers (generally electrons and holes), leading to energy levels called "energy subbands", i.e., the carriers can only have discrete energy values. Quantum wells are formed in semiconductors when a material, such as gallium arsenide, is sandwiched between two layers of a material with a wider bandgap, like aluminum arsenide. These structures can be grown, for example, by growth techniques such as those discussed above, with control of the layer thickness down to monolayers.

Not shown in FIG. 4, but available to one of skill in the art, is the addition of an electron blocking layer grown on the quantum well layer. The electron blocking layer (EBL) is an optional layer that can help increase the efficiency of nitride-based LEDs. The EBL may be made using AlGaN or any other material that provides a potential barrier for electrons to diffuse out of the active region. A typical thickness of the EBL layer is about 50 nm.

Figure 4D:
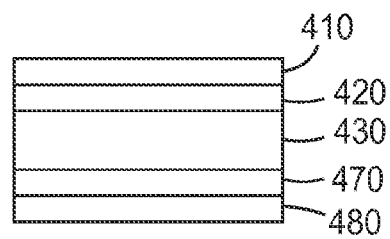

In FIG. 4d, p-doped layer 410 is then grown. Suitable materials include those discussed above, such as Mg-doped GaN. Suitable deposition methods are those outlined throughout this description. A typical thickness of the p-doped layer is about 250 nm.

Figure 4E:
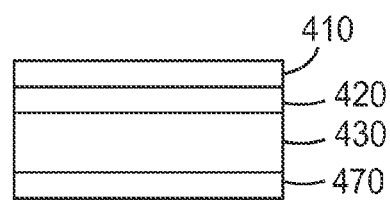

FIG. 4e shows substrate 480 removed from the rest of the device. This step can be accomplished through a number of techniques, including, e.g., laser-lift-off using an excimer laser, wherein a sapphire wafer may be coated with the appropriate GaN semiconductor layers for LED fabrication, including the metal contacts. At the stage, the LED device is still fully attached to the growth substrate. A substrate, either a temporary transfer substrate or a final substrate, may then be attached to the exposed surface of the LED device located on the opposite face of the growth substrate. Due to the difference in the absorption coefficients between sapphire and GaN at the excimer laser wavelength, the majority of the energy from the laser is preferentially deposited into the interface between the sapphire and the GaN LED device. This effectively separates the GaN LED device from the sapphire growth substrate. The EPLDs described herein have a continuous layer and may be made thick enough (on the n-layer side, for instance) to be mechanically self-supporting. This allows it to be removed from the growth substrate more easily. This is yet another advantage offered by the presently described EPLDs over physically pixelated devices.

In some embodiments, it may be desirable to first remove the substrate in manufacturing a vertical LED and then to apply an n-electrode (when the n-layer is the emission layer) so as to minimize light spreading in the LED.

Figure 4F:
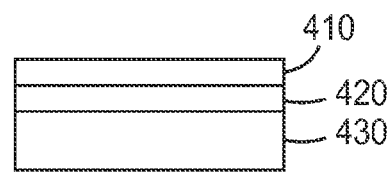

FIG. 4f shows un-doped buffer layer 470 removed from the rest of the device. While not shown, un-doped buffer layer 470 may be thinned. Un-doped buffer layer 470 may be thinned to, for instance, 5 to 99% of its original thickness. The removal or thinning may be accomplished by a number of methods, including, e.g., etching away the un-doped layer.

At this step of the process, n-doped layer 430 may also be thinned if desired (not shown). On thinning, the resulting n-doped layer may have a thickness of 5 to 99% of its original thickness.

Thinning n-doped layer 430 may be useful, for instance, in reducing light spreading for EPLDs.

Figure 4G:
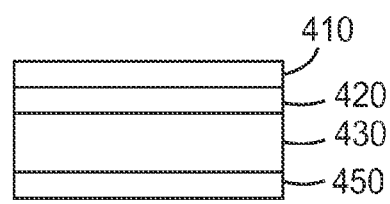

FIG. 4g depicts common electrode 450 deposited on the emission face of n-doped layer 430. One potential example of this step would involve depositing a metal grid in what will be inter-pixel regions, then depositing a transparent conductor, e.g., Indium Tin Oxide (ITO), over the remainder of the transmission surface. Another example is depositing a transparent conductor over the entire surface and then depositing the metal grid over the transparent conductor. Since the spacing between the metal grid will be typically small (less than 100 μm) and since the n-doped region typically will have high conductivity, it may not be sufficient to deposit the metal grid only and not include the transparent conductor layer.

Figure 4H:
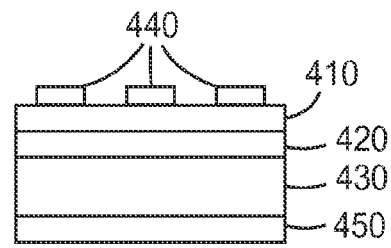

FIG. 4h depicts individually addressable electrodes 440 attached to p-doped layer 410. Individually addressable electrodes 440 may be, for instance, selected from Au, Ag, Ti, Au/Ti, Au/In, Au/Ni, and Cu.

Optionally, a color-converting array may be placed and/or bonded or attached on the emission face of the EPLD (not shown), made with, e.g. II-VI semiconductor materials such as ZnO, ZnSe, ZnS, CdS, CdSe, CdTe, CdZnSe, CdSSe, CdMgZnSe, HgCdTe or ZnSeTe (see U.S. Patent Application No. 2006/0284190) or III-V materials such as AlGaInP. Additional color-converting materials include phosphors, quantum dots, and fluorescent dyes. Suitable phosphors include doped garnets (such as YAG:Ce and (Y,Gd)AG:Ce), aluminates (such as $Sr_2Al_{14}O_{25}$:Eu, and BAM:Eu), silicates (such as SrBaSiO:Eu), sulfides (such as ZnS:Ag, CaS:Eu, and $SrGa_2S_4$:Eu), oxy-sulfides, oxy-nitrides, phosphates, borates, and tungstates (such as $CaWO_4$). These materials may be in the form of conventional phosphor powders, nanoparticle phosphor powders or films. Phosphor particles may be mixed with an organic or inorganic binder to form a film for application onto the EPLD. Another class of suitable materials is the so-called quantum dot phosphors made of semiconductor nanoparticles including Si, Ge, CdS, CdSe, CdTe, ZnS, ZnSe, ZnTe, PbS, PbSe, PbTe, InN, InP, InAs, AlN, AlP, AlAs, GaN, GaP, GaAs and combinations thereof. Generally, the surface of quantum dot will be at least partially coated with an organic molecule to prevent agglomeration and increase compatibility with a binder. In some cases the semiconductor quantum dot may be made up of several layers of different materials in a core-shell construction. Suitable fluorescent dyes include those listed in U.S. Pat. No. 6,600,175. Preferred fluorescent dyes are those that exhibit good durability and stable optical properties. The color-converting layer may consist of a blend of different types of color-converting materials in a single layer or a series of layers, each containing one or more types of color-converters. Additional optical elements, such as projection lenses or micro-lens arrays may be included added to the emission face of the EPLD. In general, an EPLD can be attached or bonded to a color forming array by any suitable method such as by an adhesive such as a hot melt adhesive, welding, pressure, heat or any combination of such methods or other methods that may be desirable in an application. Examples of suitable hot melt adhesives include semicrystalline polyolefins, thermoplastic polyesters, and acrylic resins.

Other exemplary bonding materials include optically clear polymeric materials, such as optically clear polymeric adhesives, including acrylate-based optical adhesives, such as Norland 83H (supplied by Norland Products, Cranbury N.J.); cyanoacrylates such as Scotch-Weld instant adhesive (supplied by 3M Company, St. Paul, Minn.); benzocyclobutenes such as Cyclotene™ (supplied by Dow Chemical Company, Midland, Much.); clear waxes such as CrystalBond (Ted Pella Inc., Redding Calif.); liquid, water, or soluble glasses based on Sodium Silicate; and spin-on glasses (SOG).

In some cases, an EPLD can be attached to a color forming array by a wafer bonding technique described, for example, in chapters 4 and 10 of "Semiconductor Wafer Bonding" by Q.-Y. Tong and U. Gösele (John Wiley & Sons, New York, 1999).

Typically, the pixelated surface of an EPLD according to the present description has contact with at least two electrodes. Circuitry connected to the at least two electrodes drive an electrical current to the electrodes and eventually through the continuous light emitting region, locally activating the EPLD. The pixelated surface electrodes may be individually addressed in a number of ways. These include, but are not limited to, direct solder-connection to a circuit board, connection to a complementary metal-oxide semiconductor (CMOS) circuit via various interconnect means, and solder bumps to a package or circuit board. Pixelated surface electrodes may be made of any suitable material known in the art, including but not limited to metals, or metal alloys including: gold, silver, aluminum, nickel, titanium, chromium, platinum, palladium, rhodium, rhenium, ruthenium, tungsten, indium and mixtures and alloys of such. The electrodes may also be formed from transparent conductive oxides such as ITO. Preferably the electrode materials have a high reflectivity so that rays directed to the electrode materials will be reflected by the electrode materials.

The surface opposite the pixelated surface will generally have at least one electrode. This electrode could be, for example, an interconnected metallic or metal alloy grid. The surface opposite the pixelated surface may comprise an electrode that may contain any suitable metal such as gold, silver, aluminum, indium, alloy of any of the foregoing, and/or a transparent metal alloy, or transparent conductive oxide, e.g., Indium Tin Oxide (ITO) covering the surface of the LED. Using ITO as an electrode over regions of the surface opposite the pixelated surface may allow for the formation of an electrode at the inter-pixel regions, potentially in the form of a grid. Any of the metals mentioned as suitable for the non-emission surface can be used for the metal or metal alloy grid, if desired. The use of transparent metal alloys for emission surface electrodes may be beneficial for providing higher transmission rates of generated light. The electrode could also comprise an array of individually controllable elements, e.g. stripes, allowing for greater current control through the light emitter region. The electrodes on the surface opposite the pixelated surface can be connected through a number of methods, including wire-bonding. However any other number of suitable techniques for electrode connection may be utilized.

The electrodes will typically be driven with an external controller. When pixelated surface electrodes are addressed by a circuit board, one option may be a CMOS substrate. A CMOS substrate is a substrate comprised of an integrated circuit, and thus may provide dual function of providing a mounting surface for the EPLD as well as an electrical driver. The function of the electrodes of this invention is to provide current through the active light emitter region in a location-adjustable way. Each individually addressable electrode can be seen as having a corresponding switching circuit (as illustrated by switching circuit 180 in FIG. 1), through which current flows upon activation. Therefore, the shape and placement of the emission surface and non-emission surface electrodes, as well as the voltage applied to the electrodes are especially important, as these characteristics help to determine the spatial output profile of emitted light.

Figure 5A:
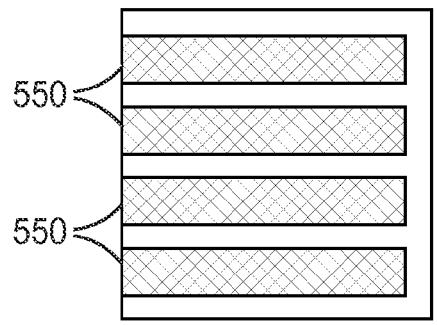
FIGS. 5a-5b are schematic views of exemplary electrode geometries.
Figure 5B:
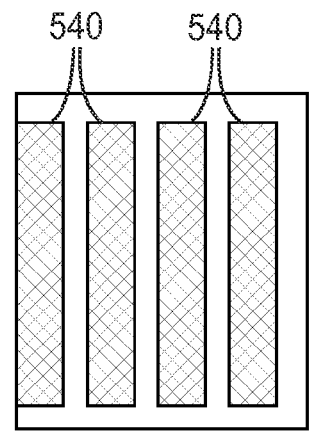

One example of individually controllable electrode elements is illustrated in FIGS. 5*a*-5*b*. In this example, the emission surface is comprised of multiple individually addressable elements 550, here in the shape of columns. These electrodes are individually addressable and controllable. The non-emission surface is connected to individually addressable and controllable electrodes 540, in row formation, such that the row and column formations of the two electrode sets are orthogonal to one another. Such a formulation allows for area control of LED emission. Upon activation of a subset of emission-surface and non-emission surface electrode areas, a voltage differential between the selected electrodes is created. Voltage greater than forward voltage of the LED results in emission of light at a desired point (that is, the intersection between the perpendicular or near perpendicular rows and columns). This emission area can be defined as a pixel. Non-activated electrodes provide no voltage greater than the forward voltage of the LED, resulting in no localized light emission. For example, a subset of emission-surface electrode and non-emission surface electrode areas can be activated such that only at the intersection of the rows and columns will light be emitted from the light emitter region. It would also be possible of course, to place the emission-surface electrodes in a manner such that they are parallel to the non-emission surface electrodes. The parallel stripe electrodes may be placed directly over a corresponding non-emission surface electrode for, e.g., production of lines of light, or may be placed such that they are staggered in horizontal distance from the non-emission surface electrodes, e.g., to create a more uniform illumination.

Figure 6A:
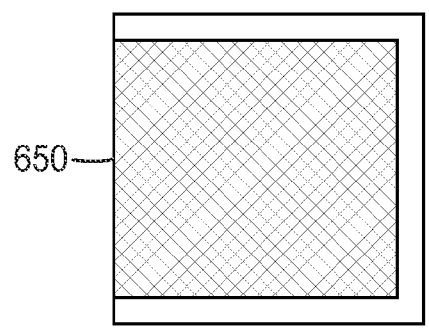
FIGS. 6a-6b are schematic views of exemplary electrode geometries.
Figure 6B:
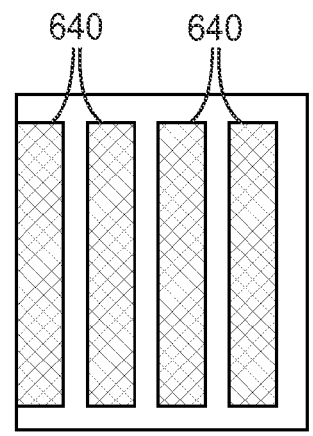

Another example of electrode formation is illustrated in FIGS. 6*a*-6*b*. In this embodiment, the emission surface electrode 650, is comprised of a common electrode covering the surface of the device. The non-emission surface has a plurality of individually addressable electrodes 640 in row formation. Such a formulation may provide for selective illumination of the display along the addressable rows 640 useful, for instance, for zonal illumination of a spatial light modulator (for instance, a transmissive imager such as a liquid crystal display, or a reflective imager such as a liquid crystal on silicon (LCOS) or digital micromirror device (DMD) imager).

Figure 7A:
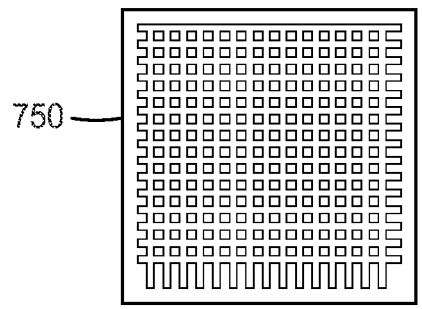
FIGS. 7a-7b are schematic views of exemplary electrode geometries.
Figure 7B:
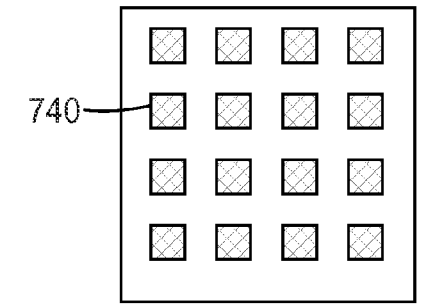
Figure 8A:
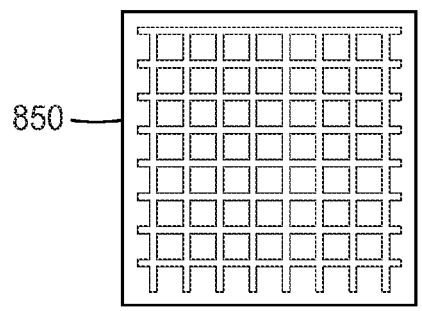
FIGS. 8a-8b are schematic views of exemplary electrode geometries.
Figure 8B:
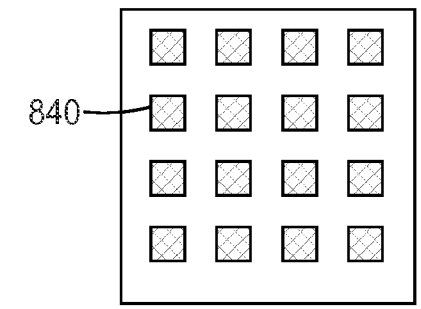
Figure 9A:
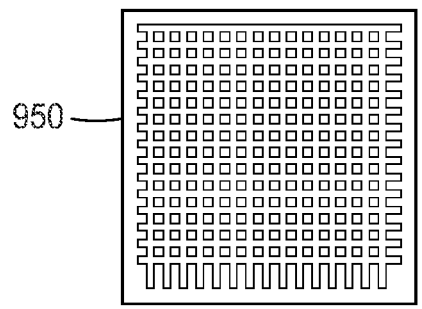
FIGS. 9a-9b are schematic views of exemplary electrode geometries.
Figure 9B:
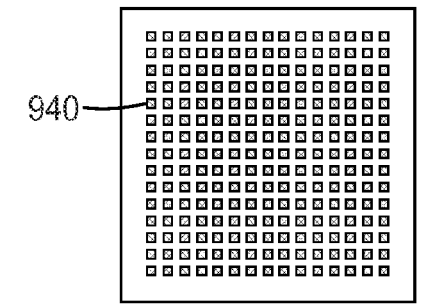

FIGS. 7*a*-9*b* illustrate a number of examples of a single emission-surface electrode in the form of a metal grid, and an array of non-emission-surface electrodes. In this embodiment the grid openings and non-emission surface electrodes are shaped as squares. However, they can take the shape of rectangle, hexagon or any other number of shapes. The use of array formation of electrodes on the non-emission face allows for controlled regional emission profiles. The grid spacing and size of non emission-surface electrodes may be selected according to the desired use of the device. For example, a closely-spaced grid with larger non-emission surface electrode array, as illustrated in FIGS. 7*a*-*b* may allow for high resolution pixilation with greater regional surface illumination. FIGS. 8*a*-8*b* provide an embodiment which provides for similar regional surface illumination, with a lower degree of resolution. Alternatively, FIGS. 9*a*-*b* depict a formulation of a closely spaced grid with corresponding small electrode array. Such an embodiment may be especially useful in high-resolution applications, such as direct-view or projection application. Also, the embodiment could be linked to different color phosphors, II-VI materials, or other color converting materials. It may then be useful for providing equal area illumination at a short mixing distance, for e.g. sequential-color LED.

Further design considerations may be relevant to designing the external controls driving the electrodes of the presently described EPLDs. For instance, the relatively thin p-type layers in the EPLDs described herein may be susceptible to damage from reverse bias breakdown. Such reverse biasing may be caused by faulty wiring of the device, transients in the drive circuitry, or static electricity. It may, therefore, be desirable to include protection circuits in the pixelated device itself or on, for instance, a CMOS drive circuit.

It may also be useful to apply a low voltage that is below the turn-on voltage for the EPLD to "off" pixels that are adjacent to "on" pixels. By doing so, this may limit the current spreading from on pixel areas to off pixel areas by reducing the voltage gradient between adjacent pixels.

The conduction through a diode junction is non-linear and, as a consequence, higher current will spread less (proportionately) than lower current. In order to minimize the pixel size, it therefore may be desirable to operate the pixels at the highest practical current. A direct view imager should produce a range of brightness to reproduce the desired gray-scale levels of a desired image which may be produced by amplitude modulation and/or pulse-width modulation. Thus, as between amplitude modulation and pulse width modulation, it may not be desirable to use amplitude modulation to control gray scale when the EPLDs described herein are used as direct view imagers. Amplitude modulation would suffer from increased current spreading for lower voltage application. In contrast, by using a pulse-width modulation drive scheme, brightness control can be accomplished while still driving the pixels at the optimal (e.g., maximal) current. In pulse width modulation driving, the pixels are operated at a target current and the duration of the current application is adjusted to achieve the desired apparent brightness.

It is not necessary for the pixels created by the activation of the light emitter region to all be the same size or shape. Pixels may be varied according to both size and shape in a manner that is regularly varied or randomly selected. It may be preferred, especially in the case of direct-viewing or illumination systems that the individually addressable electrodes be separated by a desired pixel pitch. The pixel pitch may also be varied according to placement of the electrodes in a manner that is desired for the end use.

In order to provide a light emission pattern and/or spectrum that is most accurate to the user's needs, the present description also encompasses the use of light blocking elements placed between each specific light emission region of continuous light emitter layer. Such a light-blocking element allows for deterrence of optical coupling of light from different emission regions (e.g., cross-talk between adjacent pixels), and allows light to exit the emission surface with desired properties at a desired location. Additionally, a mask may be positioned over all or part of the top surface of the EPLD in order to selectively absorb, reflect and transmit light with desirable properties (e.g. wavelength, angle of incidence, etc.).

For instance, a layer of low conductivity may be placed within the n-type layer or under the n-layer electrode (where the n-layer is the emission face layer) [or, for instance, under an ITO layer, or any other transparent conductor layer] to further confine the current path to the desired portion of the active region. Confinement may come from a patterned insulator (e.g., $SiO_2$), or from a region of the n-type layer that is implanted or doped to compensate free carriers and thereby locally increase the resistance in the n-doped layer. Further, the n-layer electrode (again, where the n-layer is the emission face layer) may be a mesh or a grid that defines the outer edges of the desired pixels. The grid can drain current from the pixel without blocking the path of light exiting the pixel from the emission face. The grid may also increase contrast by acting as a "black-mask", blocking the lateral spread of light from one pixel to adjacent pixels (e.g., by absorption). The black-mask also may help to sharpen the edges of a pixel, which may in turn make an image (i.e., when the EPLD is used as an imaging device) appear better focused.

One particularly desirable use of the current invention is as an image projection system. When used in such a system, it will potentially be desirable for the EPLD to optically couple to a pixelated spatial light modulator such that the modulator receives light emitted from the light emission surface of the EPLD has illustrated by spatial light modulator 190 in FIG. 1). This addition is especially useful for use of the light emission device in, e.g. liquid crystal or DLP displays, such as those utilized in televisions. One example of such a spatial light modulator used for the purpose of liquid crystal display would be a patterned wire-grid polarizer positioned over the emission surface. The spatial light modulator may also be comprised of a greater number of pixels than those produced in the EPLD, allowing for further pixilation of the image before viewing.

EXAMPLES

Modeling Method

A thermal and electrical model of a pixelated vertical LED was built for finite-element simulation software (ANSYS Mechanical from ANSYS, Inc, Canonsburg, Pa.). The LED was modeled as a vertical stack of layers. The model simulated square pixels in a square array pattern. In the horizontal plane, the LED model was divided into one central pixel surrounded by 8 partial pixels. Each layer was made of up to two possible materials. The primary material was aligned with the location of the pixels. An optional second material, the 'gap' material, was used to place a second material on a lattice between the pixels with a width equal to the gap width. Continuous layers had the gap material set the same as the primary material or the gap width set to zero. Individual layers were assigned a function in the model of Anode, Cathode, or Junction. The current was applied to the Anode layer and the sides of the Cathode layer were held at 0.0 volts. The diode junction model was applied as the gap conductance between the Junction layer and the next layer in the vertical stack. Perfect insulating boundary conditions (both thermal and electrical) were applied to the four vertical sides of the model.

Physical properties of the simulated materials were collected from the literature and are reported in the following table.

| Material Name | Density g/mm 3 | Thermal Conductivity W/(mm-K) | Specific Heat J/(g-K) | Electrical Resistivity Ω-mm |
|---|---|---|---|---|
| Copper | 8.95E−03 | 3.86E−01 | 3.83E−01 | 1.70E−05 |
| ITO | 6.80E−03 | 1.15E−02 | 2.33E−01 | 6.40E−03 |
| Methyl-Silicone | 1.03E−03 | 1.80E−02 | 1.46E+00 | 1.00E+12 |
| N-GaN | 6.10E−03 | 6.56E−02 | 4.90E−01 | 8.00E−02 |
| P-GaN | 6.10E−03 | 6.56E−02 | 4.90E−01 | 8.00E+00 |
| Silica | 2.16E−03 | 1.38E−03 | 7.50E−01 | 5.00E+10 |
| Silicon | 2.33E−03 | 1.24E−01 | 7.02E−01 | 1.00E−01 |

For simplicity, the properties of copper were used for the metal contacts to both the p-GaN and n-GaN layers. It is possible that the contacts would be made from other metals such as Au, Ag, Au/Ti, In, Au/In, or Au/Ni; however the physical properties of these metals are similar enough to copper for the sake of these simulations. Similarly, silica is used as the insulating filler material but it is possible to use other insulating materials, air, or vacuum as the insulator.

The simulation only modeled current distribution based on the electric potential in the diode. Diffusion of the minority carriers in the junction region of the diode can also affect the current distribution, and as such, the emission region may be slightly larger than predicted by this model.

The junction was simulated by applying a non-linear gap conductance between the p-type and n-type semiconductor layers. The junction conductivity was based on the ideal diode equation:

$$j = j_s \exp\left(\frac{qV}{nk_B T}\right)$$

where j was the current density through the junction; $j_s$ was the "saturation current"; q was the charge of an electron; V was the electric potential across the junction; n was the diode ideality factor; $k_B$ was Boltzmann's constant; and T was the absolute temperature of the junction. The values of q and $k_B$ were $1.602\times10^{-19}$ C and $1.318\times10^{-23}$ J/K respectively. The saturation current, $j_s$, and the ideality factor, n, were obtained by fitting measured I-V data for a commercial high-brightness blue nitride LED resulting in values of $j_s=5.9\times10^{-19}$ and n=2.74. The temperature, T, and the electric potential, V, were calculated by the model.

Example 1

A model was created that simulated 5 μm×5 μm pixels with continuous p-type and n-type GaN regions. The electrical contact to the p-type layer was 0.5 μm×0.5 μm and had a contact resistance of 0.01 Ω-mm². The layer structure for the model was:

| Layer | Material | Thickness mm | Gap Material | Gap Width Mm | Function |
|---|---|---|---|---|---|
| 1 | Silicon | 1.00E−02 | Silicon | 0.00E+00 | |
| 2 | Copper | 1.00E−03 | Silica | 1.00E−03 | Anode |
| 3 | Copper | 1.00E−03 | Silica | 4.50E−03 | |
| 4 | P-GaN | 1.00E−04 | Silica | 0.00E+00 | Junction |
| 5 | N-GaN | 1.00E−03 | Silica | 0.00E+00 | |
| 6 | ITO | 1.00E−03 | ITO | 0.00E+00 | |

-continued

| Layer | Material | Thickness mm | Gap Material | Gap Width Mm | Function |
|---|---|---|---|---|---|
| 7 | Silica | 1.00E−03 | Copper | 1.00E−03 | Cathode |
| 8 | Methyl-Silicone | 1.00E−02 | Methyl-Silicone | 0.00E+00 | |

The model was run with an average current density of 0.1 A/mm$^2$ (2.5×10$^{-6}$ A/pixel) applied to the anode. The cathode was held at 0V.

Figure 10:
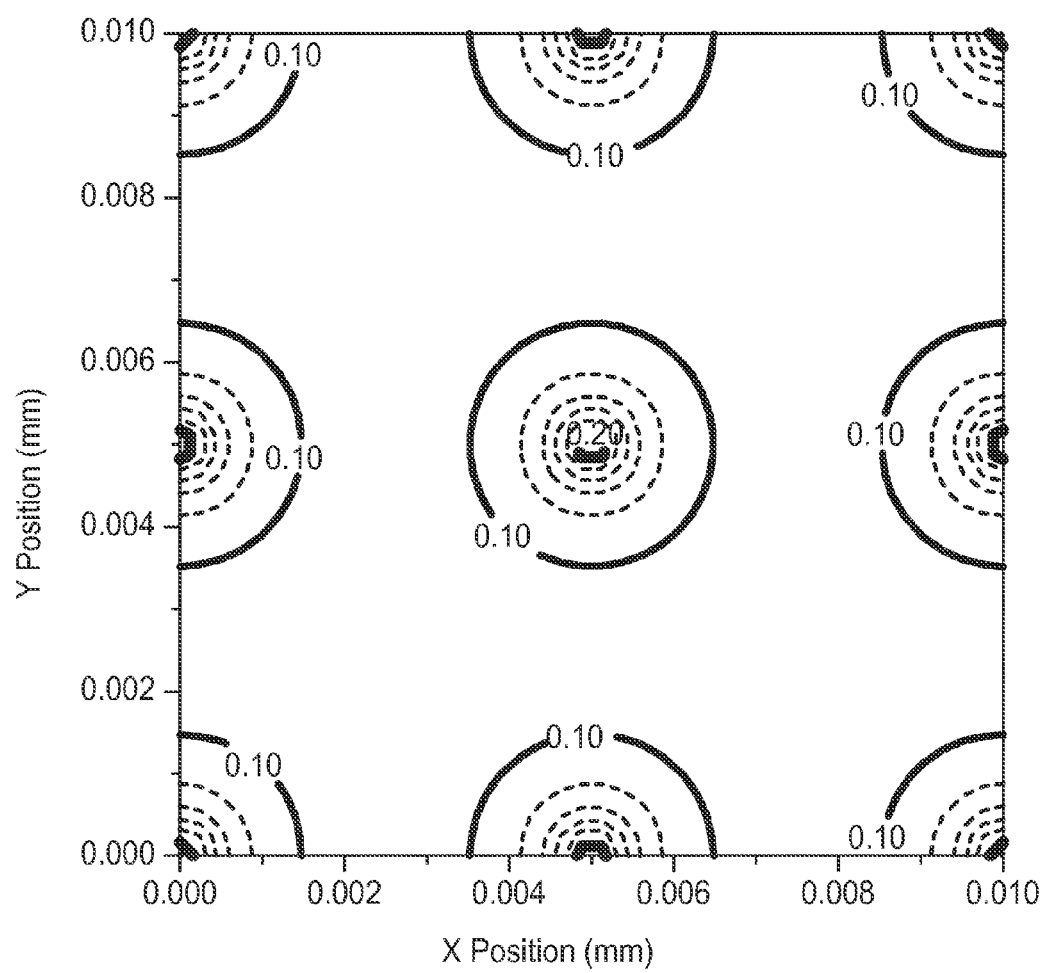
FIG. 10 is a current density contour plot according to Example 1.
Figure 11:
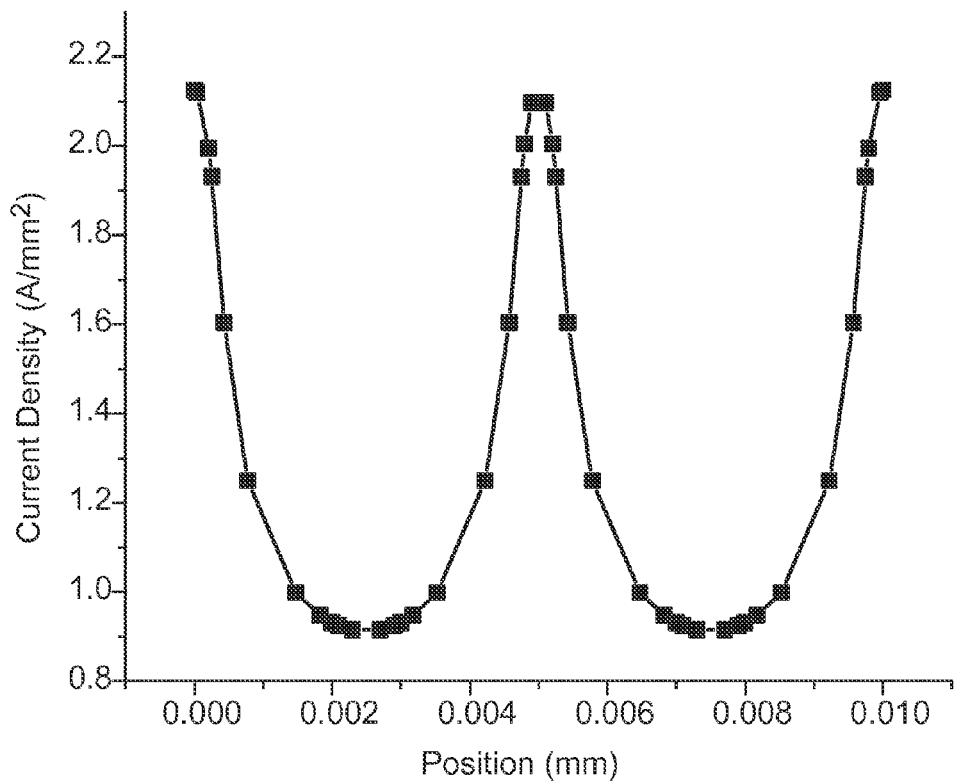
FIG. 11 is a current density plot cross section of the current density contour plot according to Example 1 taken along the edge of the model.

The current density contours calculated were plotted and is shown in FIG. 10. A cross section (taken along one edge of the model) was plotted and is shown in FIG. 11.

Example 2

The model of Example 1 was used for Example 2. The model simulated 5 µm×5 µm pixels with continuous p-type and n-type GaN regions. The electrical contact to the p-type layer was 0.5 µm×0.5 µm and had a contact resistance of 0.01 Ω-mm$^2$. The layer structure for the model was:

| Layer | Material | Thickness mm | Gap Material | Gap Width mm | Function |
|---|---|---|---|---|---|
| 1 | Silicon | 1.00E−02 | Silicon | 0.00E+00 | |
| 2 | Copper | 1.00E−03 | Silica | 1.00E−03 | Anode |
| 3 | Copper | 1.00E−03 | Silica | 4.50E−03 | |
| 4 | P-GaN | 1.00E−04 | Silica | 0.00E+00 | Junction |
| 5 | N-GaN | 1.00E−03 | Silica | 0.00E+00 | |
| 6 | ITO | 1.00E−03 | ITO | 0.00E+00 | |
| 7 | Silica | 1.00E−03 | Copper | 1.00E−03 | Cathode |
| 8 | Methyl-Silicone | 1.00E−02 | Methyl-Silicone | 0.00E+00 | |

The model was run with average current densities of 0.01, 0.1 and 1.0 A/mm$^2$ (2.5×10$^{-7}$, 2.5×10$^{-6}$, and 2.5×10$^{-5}$ A/pixel) applied to the anode. The cathode was held at 0V.

Figure 12:
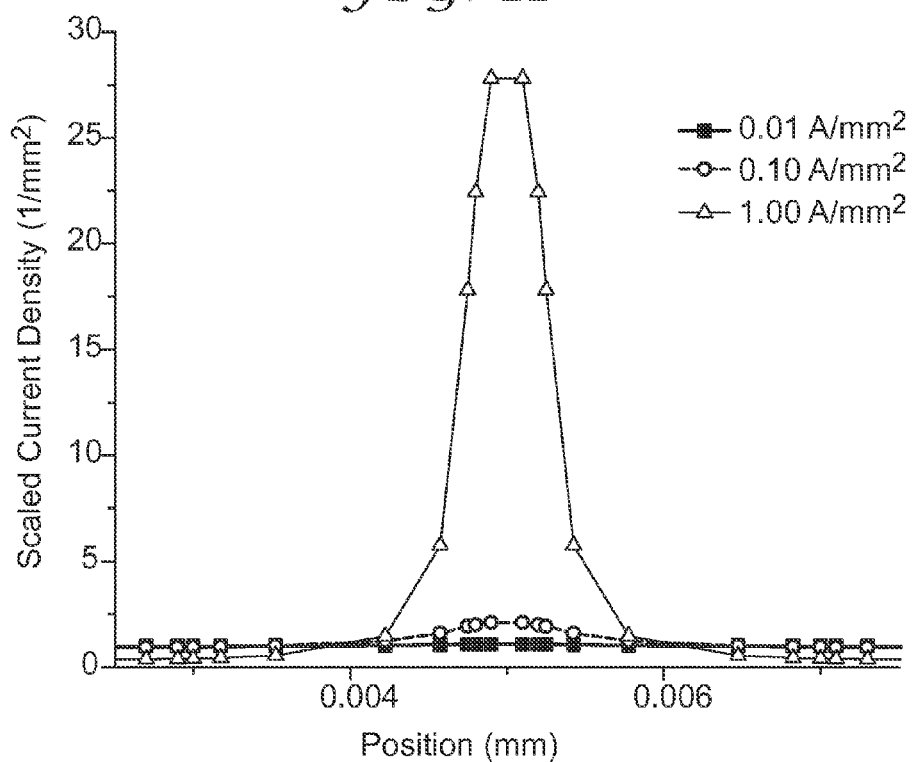
FIG. 12 is a current density plot cross section taken through the center of the pixel according to Example 2.

A current density cross-section though the center of the pixel was plotted and is shown in FIG. 12. For clarity, the current density was divided by the (applied) average current density and only the central pixel is shown.

The results of Example 2 demonstrate that the contrast between the pixel center and the edge increased with increasing current density through the pixel.

Example 3

The model of Example 1 was used for Example 3. The model simulated 5 µm×5 µm pixels with continuous p-type and n-type GaN regions. Three sizes of electrical contact to the p-GaN layer were simulated: 0.5 µm×0.5 µm, 1.0 µm×1.0 µm, and 2.0 µm×2.0 µm. The electrical contact to the p-type layer had a contact resistance of 0.01 Ω-mm$^2$. The layer structure for the model was:

| Layer | Material | Thickness mm | Gap Material | Gap Width mm | Function |
|---|---|---|---|---|---|
| 1 | Silicon | 1.00E−02 | Silicon | 0.00E+00 | |
| 2 | Copper | 1.00E−03 | Silica | 1.00E−03 | Anode |
| 3 | Copper | 1.00E−03 | Silica | varied | |
| 4 | P-GaN | 1.00E−04 | Silica | 0.00E+00 | Junction |
| 5 | N-GaN | 1.00E−03 | Silica | 0.00E+00 | |
| 6 | ITO | 1.00E−03 | ITO | 0.00E+00 | |
| 7 | Silica | 1.00E−03 | Copper | 1.00E−03 | Cathode |
| 8 | Methyl-Silicone | 1.00E−02 | Methyl-Silicone | 0.00E+00 | |

The model was run with average current density 1.0 A/mm$^2$ (2.5×10$^{-5}$ A/pixel) applied to the anode. The cathode was held at 0V.

Figure 13:
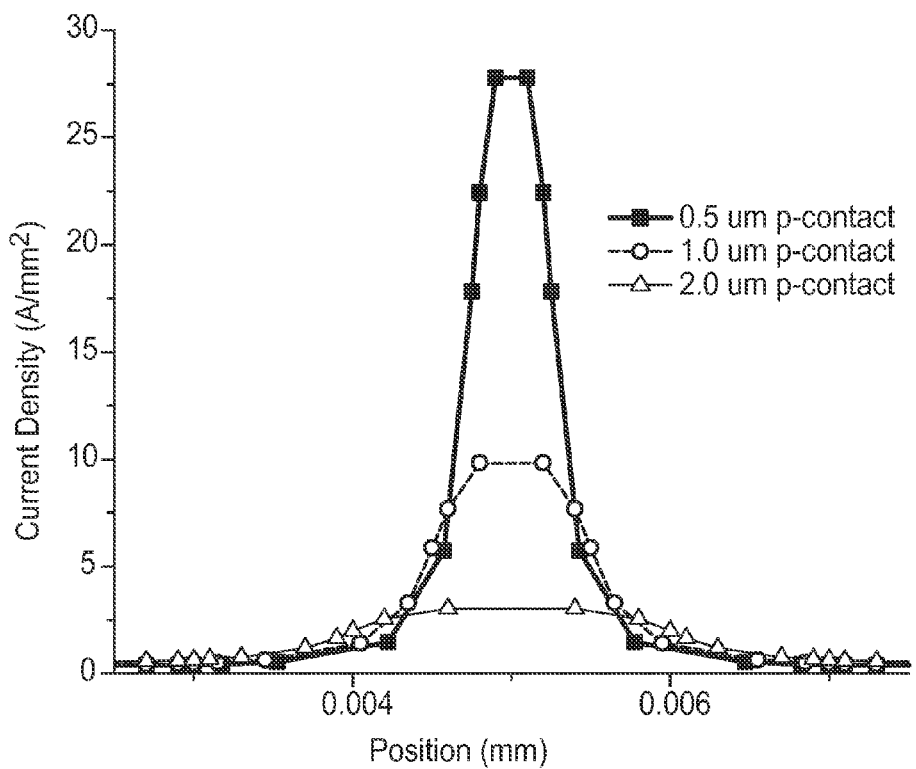
FIG. 13 is a current density plot cross section taken through the center of the pixel according to Example 3.

A current density cross-section though the center of the pixel was plotted and is shown in FIG. 13. For clarity, only the current density in the central pixel is shown.

The results of Example 3 demonstrate that the contrast between the pixel center and the edge increased with decreasing size of the metal contact to the p-GaN.

Example 4

The model of Example 1 was used for Example 4. The model simulated 5 µm×5 µm pixels with continuous p-type and n-type GaN regions. The electrical contact to the p-type layer was 0.5 µm×0.5 µm and had a contact resistance of 0.01 Ω-mm$^2$. The layer structure for the model was:

| Layer | Material | Thickness mm | Gap Material | Gap Width mm | Function |
|---|---|---|---|---|---|
| 1 | Silicon | 1.00E−02 | Silicon | 0.00E+00 | |
| 2 | Copper | 1.00E−03 | Silica | 1.00E−03 | Anode |
| 3 | Copper | 1.00E−03 | Silica | 4.50E−03 | |
| 4 | P-GaN | varied | Silica | 0.00E+00 | Junction |
| 5 | N-GaN | 1.00E−03 | Silica | 0.00E+00 | |
| 6 | ITO | 1.00E−03 | ITO | 0.00E+00 | |
| 7 | Silica | 1.00E−03 | Copper | 1.00E−03 | Cathode |
| 8 | Methyl-Silicone | 1.00E−02 | Methyl-Silicone | 0.00E+00 | |

The model was run with average current density 1.0 A/mm$^2$ (2.5×10$^{-5}$ A/pixel) applied to the anode. The cathode was held at 0V. The p-GaN layer was continuous and the model was run with three values of the thickness: 0.1, 0.2, and 0.3 µm.

Figure 14:
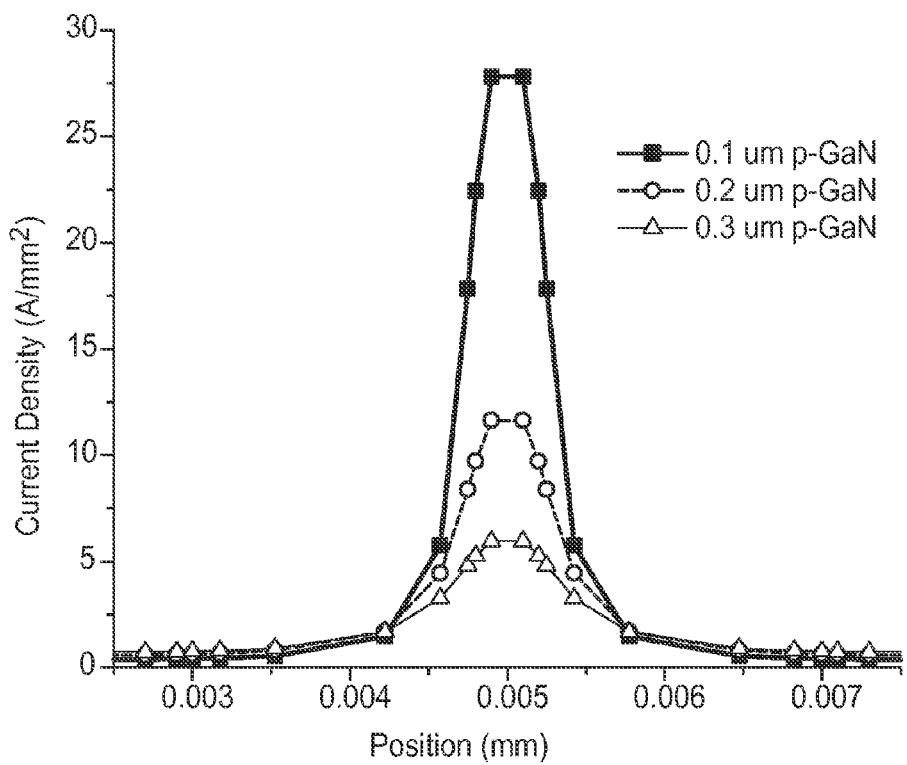
FIG. 14 is a current density plot cross section taken through the center of the pixel according to Example 4.

A current density cross-section though the center of the pixel for the three p-GaN layer thicknesses was plotted and is shown in FIG. 14. For clarity, only the current density in the central pixel is shown.

The results of Example 4 demonstrate that the contrast between the pixel center and the edge increased with decreasing thickness of the p-GaN layer.

Example 5

The model of Example 4 was used for Example 5. The model simulated 5 µm×5 µm pixels with continuous n-type GaN regions. The p-type region was 0.3 µm thick and was patterned to be exactly the same width as the electrical contact to the p-type GaN, simulating the possibility of etching the p-GaN layer down to, but not through the junction. The electrical contact to the p-type layer was 0.5 µm×0.5 µm and had a contact resistance of 0.01 Ω-mm$^2$.

The layer structure for the model was:

| Layer | Material | Thickness mm | Gap Material | Gap Width mm | Function |
|---|---|---|---|---|---|
| 1 | Silicon | 1.00E−02 | Silicon | 0.00E+00 | |
| 2 | Copper | 1.00E−03 | Silica | 1.00E−03 | Anode |
| 3 | Copper | 1.00E−03 | Silica | 4.50E−03 | |
| 4 | P-GaN | 3.00e−04 | Silica | 4.50E−03 | Junction |
| 5 | N-GaN | 1.00E−03 | Silica | 0.00E+00 | |
| 6 | ITO | 1.00E−03 | ITO | 0.00E+00 | |
| 7 | Silica | 1.00E−03 | Copper | 1.00E−03 | Cathode |
| 8 | Methyl-Silicone | 1.00E−02 | Methyl-Silicone | 0.00E+00 | |

The model was run with average current density $1.0 \, A/mm^2$ ($2.5 \times 10^{-5}$ A/pixel) applied to the anode. The cathode was held at 0V.

Figure 15:
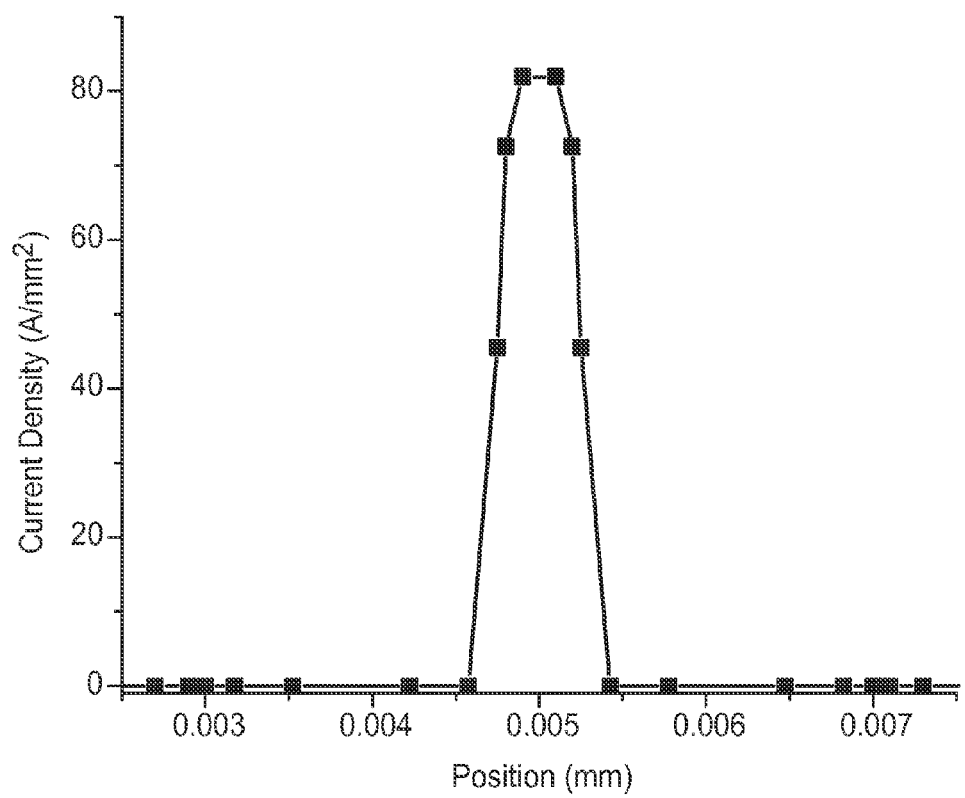
FIG. 15 is a current density plot cross section taken through the center of the pixel according to Example 5.

A current density cross-section though the center of the pixel was plotted and is shown in FIG. 15. For clarity, only the current density in the central pixel is shown.

The results of Example 5 demonstrate that the contrast between the pixel center and the edge can be increased by thinning or removing portions of just the p-GaN layer.

Example 6

A model was created that simulated 2.5 μm×2.5 μm pixels with continuous p-type and n-type GaN regions. The electrical contact to the p-type layer was 0.5 μm×0.5 μm and had a contact resistance of 0.01 Ω-mm². The layer structure for the model was:

| Layer | Material | Thickness mm | Gap Material | Gap Width mm | Function |
|---|---|---|---|---|---|
| 1 | Silicon | 1.00E−02 | Silicon | 0.00E+00 | |
| 2 | Copper | 1.00E−03 | Silica | 1.00E−03 | Anode |
| 3 | Copper | 1.00E−03 | Silica | 2.00E−03 | |
| 4 | P-GaN | 1.00E−04 | Silica | 0.00E+00 | Junction |
| 5 | N-GaN | 1.00E−03 | Silica | 0.00E+00 | |
| 6 | ITO | 1.00E−03 | ITO | 0.00E+00 | |
| 7 | Silica | 1.00E−03 | Copper | 1.00E−03 | Cathode |
| 8 | Methyl-Silicone | 1.00E−02 | Methyl-Silicone | 0.00E+00 | |

The model was run with average current densities of 4.0 $A/mm^2$ ($2.5 \times 10^{-5}$ A/pixel) applied to the anode. The cathode was held at 0V.

Figure 16:
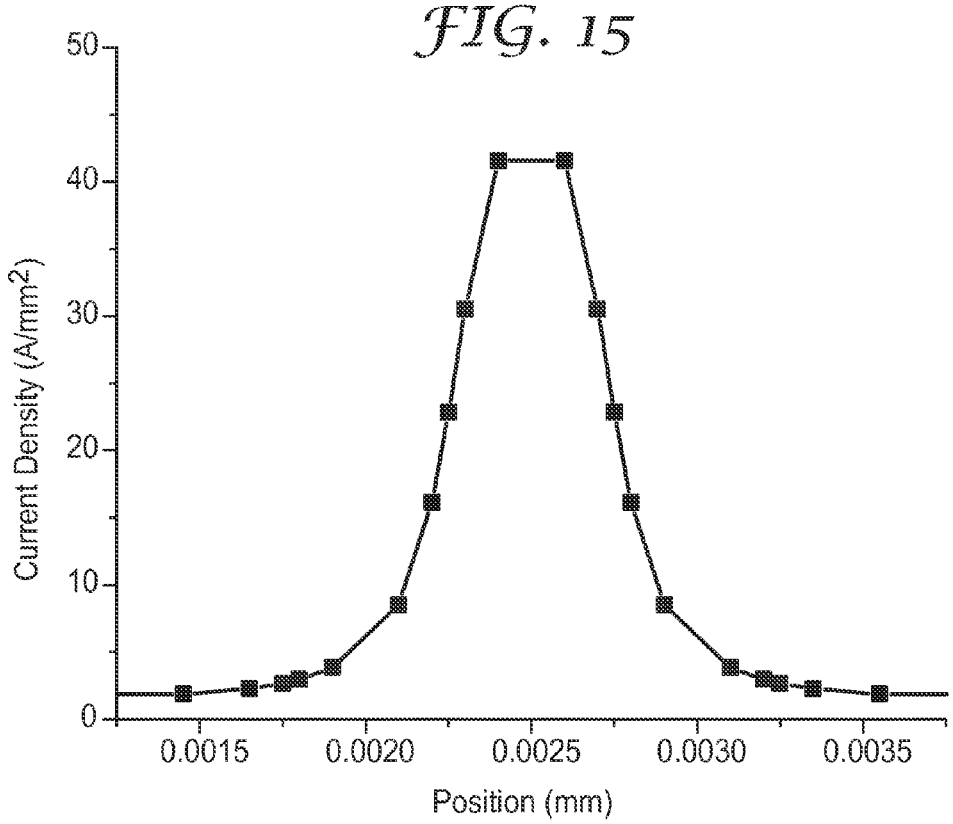
FIG. 16 is a current density plot cross section taken through the center of the pixel according to Example 6.

A current density cross-section though the center of the pixel was plotted and is shown in FIG. 16. For clarity, only the current density in the central pixel is shown.

The results of Example 6 demonstrate that the current can be confined in a portion of the junction that is about 1 μm×1 μm.

The invention claimed is:

1. An electrically driven pixelated lumination device (EPLD) comprising:
   a p-layer having a p-layer electrode surface and a p-layer interface surface;
   an n-layer having an n-layer electrode surface and an n-layer interface surface;
   a continuous light emitter region disposed between the n-layer interface surface and the p-layer interface surface, wherein the continuous light emitter region comprises a diode junction and is not a separate layer of material;
   at least one p-layer electrode positioned on the p-layer electrode surface;
   at least one n-layer electrode positioned on the n-layer electrode surface;
   wherein at least one of the p-layer electrode or n-layer electrode comprises a plurality of individually addressable electrodes.

2. The EPLD of claim 1 wherein the p-layer electrode comprises a plurality of individually addressable electrodes.

3. The EPLD of claim 1 wherein the n-layer electrode comprises a plurality of individually addressable electrodes.

4. The EPLD of claim 1 further comprising a switching circuit for each of the plurality of individually addressable electrodes.

5. An EPLD comprising:
   an outer semiconductor layer comprising a light emission face that comprises a common electrode;
   an inner semiconductor layer comprising a non-emission face that comprises a plurality of individually addressable electrodes; and
   a continuous light emitter region disposed between the outer semiconductor layer and the inner semiconductor layer, wherein the continuous light emitter region comprises a diode junction and is not a separate layer of material;
   wherein the EPLD comprises an average pixel size, and the plurality of individually addressable electrodes contacts the non-emission face with a contact surface area smaller than the average pixel size.

6. The EPLD of claim 5 wherein the outer semiconductor layer is a continuous n-doped semiconductor layer.

7. The EPLD of claim 6 wherein the n-doped semiconductor layer comprises a metal nitride selected from In, Ga, Al or an alloy thereof.

8. The EPLD of claim 6 wherein the outer semiconductor layer is partially etched to create channels and the channels are optionally filled with material selected from (i) light absorbing material, (ii) electrically insulating material, (iii) a reflective material, or (iv) a combination of any of (i) to (iii).

9. The EPLD of claim 5 wherein the outer semiconductor layer is a p-doped semiconductor layer.

10. The EPLD of claim 9 wherein the p-doped semiconductor layer is etched at least partway through the layer.

11. The EPLD of claim 10 wherein the p-doped semiconductor layer is etched completely through the layer.

12. The EPLD of claim 5 further comprising a switching circuit for each of the individually addressable electrodes.

13. The EPLD of claim 12 wherein the individually addressable electrodes are separated by a pixel pitch of 10 μm or less.

14. A method for generating pixelated light comprising electrically addressing at least two of a plurality of individually addressable electrodes of the EPLD according to claim 5.

15. A pixelated light emitting system comprising
   an outer semiconductor layer comprising a light emission face that comprises a common electrode;
   an inner semiconductor layer comprising a non-emission face that comprises a plurality of individually addressable electrodes;
   a continuous light emitting region disposed between the outer semiconductor layer and the inner semiconductor layer, wherein the continuous light emitter region comprises a diode junction and is not a separate layer of material; and a circuit for supplying current to each of the individually addressable electrodes wherein when each of the individually addressable electrodes is addressed the pixelated light emitting system emits a spatially unique pattern of light.

16. An optical system comprising the pixelated light emitting system of claim 15 and a pixelated spatial light modulator for receiving light emitted by the pixelated light emitting system.

17. The optical system of claim 16 wherein the light emitting system has fewer pixels than the spatial light modulator.

* * * * *